United States Patent
Edwards et al.

[11] Patent Number: 5,981,961
[45] Date of Patent: Nov. 9, 1999

[54] APPARATUS AND METHOD FOR IMPROVED SCANNING EFFICIENCY IN AN ION IMPLANTER

[75] Inventors: Peter I. T. Edwards; Christopher P. Wright; Peter T. Kindersley; Richard Cooke, all of West Sussex; Stephen S. Chamberlain, South Gloucestershire, all of United Kingdom

[73] Assignee: Applied Materials, Inc., Santa Clara, Calif.

[21] Appl. No.: 08/929,799

[22] Filed: Sep. 15, 1997

Related U.S. Application Data

[63] Continuation-in-part of application No. 08/617,652, Mar. 15, 1996, abandoned.

[51] Int. Cl.⁶ .................................................. H01J 37/304
[52] U.S. Cl. .................. 250/492.21; 250/397; 250/398
[58] Field of Search ........................... 258/492.21, 398, 258/397

[56] References Cited

U.S. PATENT DOCUMENTS

| | | |
|---|---|---|
| 3,689,766 | 9/1972 | Freeman .............................. 250/492.21 |
| 4,260,897 | 4/1981 | Bakker et al. . |
| 4,276,477 | 6/1981 | Enge . |
| 4,419,584 | 12/1983 | Benveniste . |
| 4,421,988 | 12/1983 | Robertson et al. . |
| 4,476,393 | 10/1984 | Taya et al. .............................. 250/398 |
| 4,633,138 | 12/1986 | Tokiguchi et al. . |
| 4,672,210 | 6/1987 | Armstrong et al. . |
| 4,736,107 | 4/1988 | Myron . |
| 4,751,393 | 6/1988 | Corey, Jr. et al. . |
| 4,761,559 | 8/1988 | Myron . |
| 4,804,852 | 2/1989 | Rose et al. . |
| 4,922,106 | 5/1990 | Berrian et al. ..................... 250/492.21 |
| 4,980,562 | 12/1990 | Berrian et al. . |
| 5,053,627 | 10/1991 | Ruffell et al. ...................... 250/492.21 |
| 5,229,615 | 7/1993 | Brune et al. . |
| 5,350,926 | 9/1994 | White et al. ....................... 250/492.21 |
| 5,389,793 | 2/1995 | Aitken et al. ...................... 250/492.21 |
| 5,432,352 | 7/1995 | van Bavel . |

FOREIGN PATENT DOCUMENTS

| | | |
|---|---|---|
| 0542560 | 5/1993 | European Pat. Off. . |
| 0644573A1 | 3/1995 | European Pat. Off. . |
| 0660369A1 | 6/1995 | European Pat. Off. . |
| 686995 | 12/1995 | European Pat. Off. . |
| A1 0686995 | 12/1995 | European Pat. Off. . |
| 59-103262 | 6/1984 | Japan . |

OTHER PUBLICATIONS

N. Turner, "Comparison of Beam Scanning Systems," Proceedings of the 4th International Conference on Ion Implantation: Equipment and Techniques, Sep. 13–17, 1982, pp. 126–142.

*Primary Examiner*—Bruce C. Anderson
*Attorney, Agent, or Firm*—Boult Wade Tennant

[57] ABSTRACT

An ion implanter for implanting ions into a substrate comprises an ion beam generator for generating a beam of ions, support means for carrying a substrate to be implanted with beam ions, scanning means for scanning at least one of the substrate and the ion beam relative to the other so that the beam traverses the substrate along a predetermined path. Monitoring means are arranged to monitor changes in the proportion of the ion beam cross-sectional area incident on the substrate as the ion beam traverses the edge of the substrate from a position in the scan at which the proportion is finite to a position at which the proportion is zero. The implanter further comprises detection means responsive to the monitoring means for detecting the moment when the proportion reaches zero from a finite value as the ion beam and/or substrate moves along the predetermined path, and operative means responsive to the detection means detecting the moment when the proportion of the beam cross-sectional area incident on the substrate reaches zero, for performing a subsequent operation in the ion implanter.

53 Claims, 11 Drawing Sheets

MOVING TOWARDS
MIN SCAN >>

MOVING TOWARDS
MIN SCAN >>

APPARATUS AND METHOD FOR IMPROVED SCANNING EFFICIENCY IN AN ION IMPLANTER

CROSS REFERENCE TO RELATED APPLICATION

This is a continuation-in-part application Ser. No. 08/617,652, filed Mar. 15, 1996 now abandoned, which is hereby incorporated by reference.

FIELD OF THE INVENTION

This invention relates to ion implanters for implanting ions into a target substrate and in particular to ion implanters in which at least one of the ion beam and target substrate is scanned relative to the other during ion implantation.

DISCUSSION OF PRIOR ART

Ion implanters are commonly used in the manufacture of semiconductor and metallic products for implanting ions in semiconductor or metallic substrates to change the conductivity of the material in predefined regions. Ion implanters generally comprise an ion beam generator for generating a beam of ions, a mass analyser for selecting a particular specie of ions in the ion beam and means to direct the ion beam onto a target substrate. The ion beam cross-sectional area depends on such factors as the beam line configuration, the degree of focusing applied to the ion beam, the gas pressure along the beam line, the energy of the ion beam and the mass of the ions. Frequently, the ion beam cross-sectional area at the target substrate is less than the surface area of the substrate which necessitates traversal of the beam over the substrate in a one or two-dimensional scan so that the beam covers the whole surface thereof. The three two-dimensional scanning techniques commonly employed in ion implantation are (i) electrostatic and/or magnetic deflection of the ion beam relative to a static substrate, (ii) mechanical scanning of the target substrate in two dimensions relative to a static ion beam and (iii) a hybrid technique involving magnetic or electrostatic deflection of the ion beam in one direction and mechanical scanning of the target substrate in another generally orthogonal direction.

An important objective in the fabrication of semiconductor wafers is to minimise the processing time and maximise wafer throughput. A common objective in ion implantation processes is to ensure that for a selected specie of ions, the wafers are implanted with the correct ion dose and that the dose is uniform across the wafer. At present, the semiconductor industry frequently demands a dose uniformity of about 1% or better.

Generally, scanning consumes a significant fraction of the total time it takes to process a single wafer, and therefore it is important to ensure that efficient use is made of the ion beam during the scanning process. A number of techniques for improving scan efficiency have been proposed.

U.S. Pat. No. 4,421,988 by Robertson et al discloses an apparatus for scanning an ion beam in two dimensions over the surface of a single static wafer by deflecting the beam electrostatically using two pairs of mutually orthogonal electrodes. From a given position in the vertical or y-scan, the scanning length in the horizontal or x-scan is controlled to substantially coincide with the dimension of the wafer so as to minimise the amount by which the ion beam overscans the edge of the wafer. The x-scan is generated by applying a voltage to the electrodes having a triangular waveform whose frequency determines the scanning length. The y-scan progresses in a step-wise manner and is initiated at the end of each x-scan so that the beam traverses the wafer in a series of parallel scans. The scanning pattern is stored in a ROM which controls the frequency of the triangular waveform. The ROM can be programmed with a number of scanning patterns appropriate to different wafer sizes.

U.S. Pat. No. 4,736,107 and U.S. Pat. No. 4,761,559, both by Miron, disclose an ion beam scanning apparatus for an ion implanter in which the ion beam is scanned electrostatically in both the x and y directions simultaneously and at the same speed, producing scan lines oriented at 45°. The scanning pattern is similar to that disclosed in U.S. Pat. No. 4,421,988, and predetermined scanning patterns according to wafer size are stored in a programmable read only memory (PROM). The ion beam current can be monitored as a function of beam position by applying the scanning electrode control voltages to the horizontal sweep of a CRT and applying a signal from a Faraday cup sensor, which measures the ion beam current impinging on the wafer, to the vertical sweep. A delay is introduced into the signal from the scanning electrodes in order to allow for the time of flight of the ion beam from the scanning electrodes to the wafer. The CRT display allows an operator to focus and centre the ion beam and to adjust the scanning length to minimise the amount of overscan.

U.S. Pat. No. 4,260,897 by Bakker et al also describes a scanning apparatus for an ion implanter involving electrostatic deflection of the ion beam over the surface of a single wafer in which the scanning pattern describes a series of parallel scanning lines separated by a fixed distance from one another, as disclosed in the above cited references. In order to control the amount by which the ion beam scans beyond the edge of a circular wafer, two arcuate, electrically conductive strips are positioned near the edge of the wafer for sensing beam current. When the ion beam strikes one of the arcuate strips, a voltage pulse is generated and delivered to a set-reset flip-flop which changes state and causes an increment or decrement in the y-scan and reversal of the direction of the x-scan. Similarly, diametrically opposed sensors are placed near the extreme upper and lower edges of the wafer also for sensing the beam current and controlling reversal of the direction of the y-scan.

U.S. Pat. No. 4,633,138 by Tokiguchi et al and U.S. Pat. No. 4,980,562 by Berrian et al both disclose scanning apparatus of the hybrid type, in which the ion beam is scanned horizontally across the wafer by magnetic deflection and the wafer is mechanically scanned through the ion beam in the vertical direction. In the former reference, the mechanical scanning arrangement comprises a carrier on which a plurality of wafers are mounted and introduced consecutively into the ion beam along a straight line. The width of the circular wafer at the position of the ion beam is monitored by monitoring the width of the wafer immediately above at a corresponding vertical position, using horizontal arrays of LEDs and photo diodes placed either side of the wafer. For a given vertical position in the mechanical scan, the beam sweep width is controlled to be approximately the same width as the wafer by a signal converter which interprets the signal generated by the photo-detectors. The mechanical scanning arrangement further comprises a carrier speed controller which varies the carrier speed inversely proportionally to the detected width of the wafer.

The latter reference describes a scanning arrangement in which a single wafer is scanned mechanically in the vertical direction and scanned magnetically in the horizontal direction. A Faraday detector is positioned near one edge of the carrier carrying the wafer for monitoring ion dose, which is used to control the speed of the mechanical scan in order to obtain a uniform dose over the wafer. In the horizontal fast scan, the ion beam is scanned beyond the edge of the target wafer by a distance on the order of one-half of the beam diameter in order to ensure dose accuracy near the edges of the target wafer. The ion beam is overscanned to the Faraday detector less frequently than the horizontal scanning frequency to mitigate the reduction in beam utilisation efficiency in monitoring dose during implantation. Scanning efficiency is increased and overscanning reduced in the mechanical scan by implanting during both acceleration and deceleration as the mechanical scan reverses direction. This is achieved by varying the horizontal scanning rate in relation to the position of the wafer in the vertical scan.

EP-A-0686995 by Hirokawa et al discloses a scanning arrangement in which the wafer substrate is scanned mechanically in two dimensions through a stationary ion beam. The scanning arrangement comprises a disk on which a plurality of target wafers are mounted near the circumference thereof and which is rotated at high speed so that wafers are successively and cyclically scanned through the ion beam along an arcuate scanning path. The disk is mounted on a support assembly which moves the disk in the vertical direction so that the wafers are scanned slowly in the radial direction. Regions of the disk between the wafers are removed to allow the ion beam to be detected by a Faraday cup located downstream of the disk. Beam dosage is monitored by the Faraday detector during ion implantation and the vertical scanning speed is varied according to the beam current to ensure ion dose uniformity across the wafers.

U.S. Pat. No. 4,672,210 by Armstrong et al discloses a mechanical scanning arrangement including a spinning disk, in which an ion beam which has a rectangular cross-section is oriented obliquely relative to the radial scanning direction in order to reduce overscan, and at the same time avoid striping.

SUMMARY OF THE INVENTION

An object of the present invention is to provide a scanning apparatus having improved scanning efficiency.

According to the present invention there is provided an ion implanter for implanting ions into a substrate, comprising an ion beam generator for generating a beam of ions, a support for carrying one or more substrates to be implanted with beam ions and scanning means for scanning at least one of the substrate and the ion beam relative to the other so that the beam traverses the wafer along a predetermined path. Monitoring means is arranged to monitor changes in the proportion of the ion beam cross-sectional area incident on the substrate as the ion beam traverses the edge of the substrate from a position in the scan at which the ion beam is incident on the substrate to a position at which no part of the ion beam is incident on the substrate. The invention further comprises a detector responsive to the monitoring means for detecting the moment when the proportion of cross-sectional area incident on the substrate reaches zero as the ion beam crosses the edge of the substrate, and operative means responsive to the detection means detecting that moment for performing a subsequent operation in the ion implanter.

In a preferred embodiment, the monitoring means comprises means for monitoring the ion beam current, such as a Faraday cup.

The operative means may comprise a controller for controlling changes in the scanning direction. Alternatively, or in addition, the operative means may comprise a processor for storing a measured ion beam parameter, such as beam current or dose, in an electronic memory.

Thus, one aspect of the present invention provides a scanning arrangement in which a signal is generated at the moment when the ion beam is just off the target substrate as the beam traverses the edge of the substrate so that a further process in the ion implanter can be initiated, such as scan reversal. Advantageously, this arrangement allows the actual moment when the ion beam is just fully off the wafer to be determined exactly without having to make any assumptions about beam width, wafer size or wafer position, as are required in the prior art arrangements. Thus, this arrangement can be used to ensure that there is no inaccuracy in ion dosage at the edge of the wafer which might otherwise result from an incorrect assumption as to the size or position of the wafer or the width of the beam, and can also be used to minimise the time during which the ion beam is off the wafer so as to substantially increase beam utilisation efficiency.

BRIEF DESCRIPTION OF THE DRAWINGS

Examples of embodiments of the present invention will now be described with reference to the drawings, in which.

DESCRIPTION OF PREFERRED EMBODIMENTS

Figure 1:
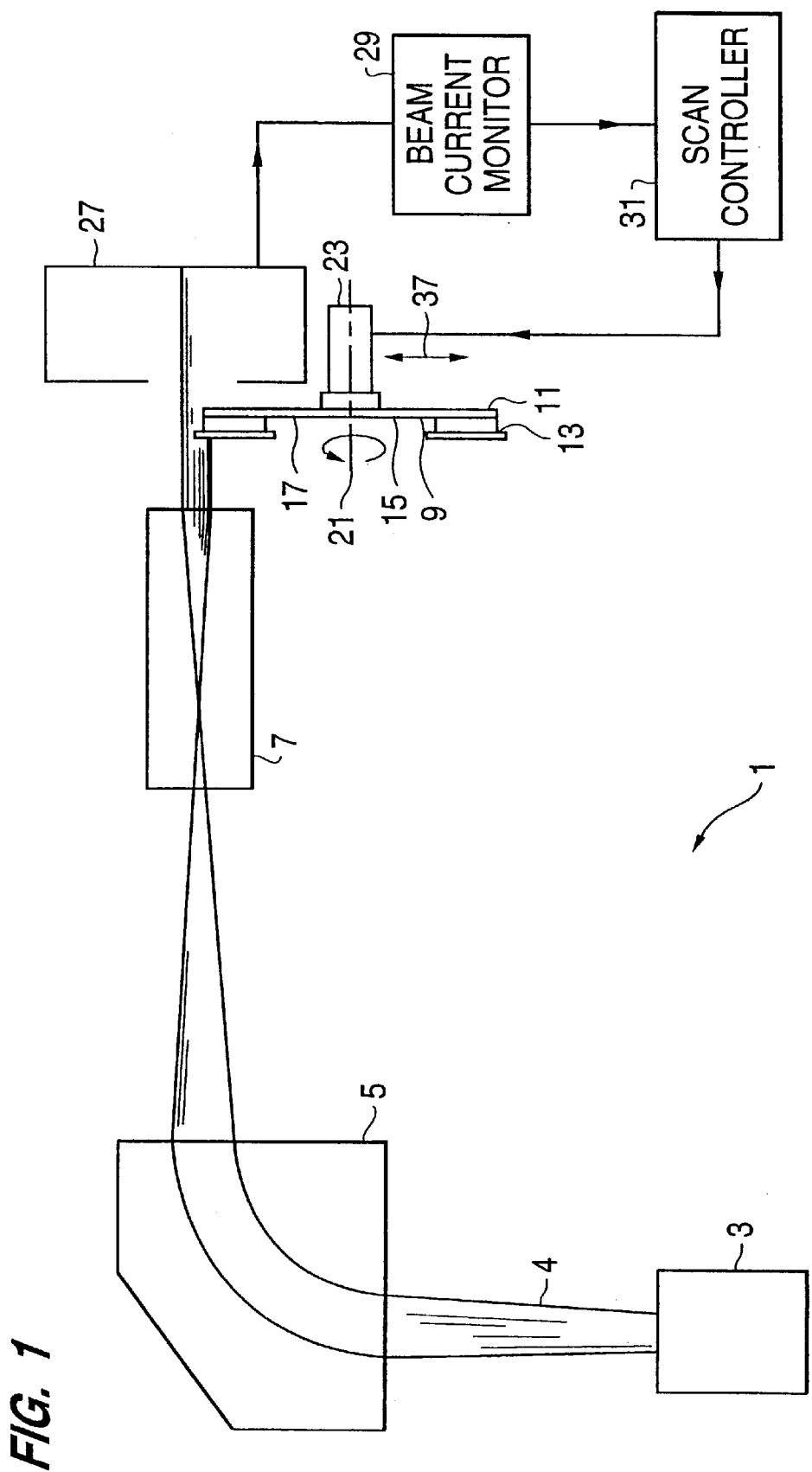
FIG. 1 is a schematic plan view of an ion implanter according to an embodiment of the present invention.
Figure 3:
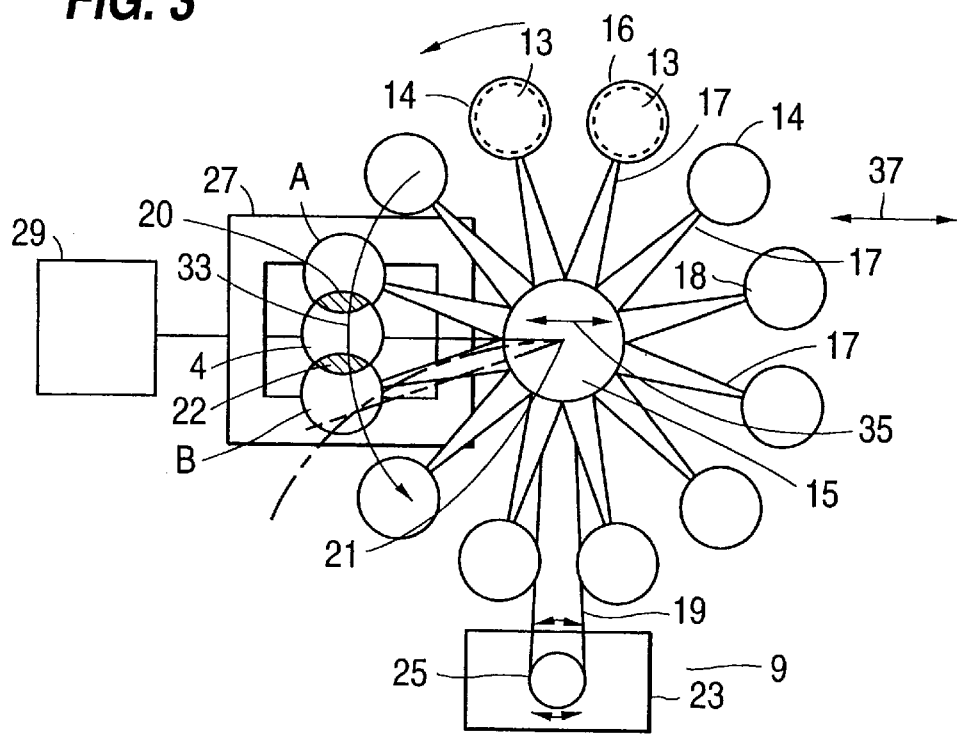
FIG. 3 shows the front view of a scanning arrangement.

Referring to FIG. 1, an ion implanter generally indicated at 1 comprises an ion beam generator 3 for generating a beam of ions, a mass analyser 5 (e.g. a magnet) for selecting a particular specie of ions for the implant and an ion beam controller 7 which may include spatial filters for filtering out unwanted species of ions, means for focusing the ion beam and means for controlling the energy of the ion beam. With reference to FIGS. 1 and 3, the ion implanter 1 further includes a target substrate support assembly 9 for carrying a plurality of target substrates 14, for example semiconductor wafers. The support assembly 9 comprises a rotary wheel 11 having a plurality of substrate carriers 13 spaced radially from and connected to a central hub 15 by respective arms or spokes 17. The spoked wheel 11 is rotatably mounted at one end of a scanning arm 19 and is free to rotate about a central axis 21. The scanning arm 19 is generally upstanding and the other end thereof is rotatably mounted on a scan drive assembly 23, which rotates the scanning arm about an axis 25.

A Faraday cup or bucket 27 is positioned downstream of the rotary wheel and is arranged to receive all of the ion beam which passes beyond the spoked wheel 11. A beam current monitor 29 is connected to the Faraday cup 27 for monitoring beam current and generating a signal indicative of the beam current amplitude at the output thereof. A scan controller 31 receives signals from the beam current monitor 29 and controls the scan drive 23, as will be described in more detail below.

During ion implantation, the wheel is rotated at a relatively high speed, for example 1200 rpm so that each wafer is successively and cyclically introduced into the ion beam along an arcuate path 33. At the same time, the scanning arm 19 is rotated by the scan drive 23 about its drive axis 25 and drives the wheel 11 along an arc 35 whose centre is axis 25 so that the target substrates 14 are scanned through the ion beam in the radial direction 37. During a single implant, the wafers may be scanned back and forth through the beam in the radial direction 37, for example between 10 and 200 times or more. At the end of the implant, the processed wafers are removed from the wheel and new wafers are loaded for the next implant process. During ion implantation, it is important to monitor the accumulated implant dose so that appropriate measures can be taken during the implant process to ensure that ions are implanted to the correct final dose. The accumulated dose can be monitored at the end of each outward scan (i.e. wheel 11 moving out of the beam) by measuring the full beam current collected by the Faraday cup 27 when the wheel 11 and substrates 14 are completely clear of the beam line. Traditionally, the full beam current is measured once the scan arm has returned to its initial scan position, where it can be said with certainty that the wheel is fully clear of the beam line, even for a beam of maximum possible width. This method ensures that the wheel is fully clear of the beam before the beam current is measured so that the dose is measured accurately, and by-passes the difficulties in measuring beam width, which depends on such factors as beam energy, beam line gas pressure, the particular specie of ions in the beam and the degree of focusing. An optical or other position sensor is used to detect when the scan arm has returned to the initial scan position and stop the scan drive. The beam current is then measured while the scan arm is at rest at the initial scan position and the beam current or the accumulated dose is recorded before the next inward scan begins.

Furthermore, in the mechanical scanning arrangement shown in FIGS. 1 and 3, it is important that the correct radial scanning speed is maintained across the whole width of the wafer substrate. Reversing the direction of the scan takes a finite interval of time due to the inertia of the wheel and scanning arm. Therefore it is important to ensure that the wheel is completely clear of the ion beam before reversing the direction of the scan. If the scan is reversed too early i.e. when the ion beam is still impinging on the edge of the wafer, the radial scanning speed would be reduced to below the correct scanning speed as the arm decelerates so that the latter part of the wafer spends more time in the ion beam than it should and receives a larger dose. Again, since it is difficult to know the precise position of the edge of the beam, previously, the wheel was moved to an extreme position where it could be said with certainty that the wheel was completely clear of the ion beam for the maximum possible beam width. However, as mentioned above, the beam width is dependent on a number of different parameters and can vary typically from 1 mm to 10 cms. Therefore, for all values of beam width other than the maximum value, the wafers would spend more time out of the beam, at the end of each scan, than necessary. One aspect of the present invention is concerned with reducing the scan turnaround time so as to make more efficient use of the ion beam.

In one aspect, the present invention employs a monitor for monitoring changes in the proportion of the ion beam cross-sectional area incident on a substrate as the ion beam traverses the edge of the substrate and a detector responsive to the monitor for detecting the moment at which the proportion of the ion beam cross-sectional area incident on the substrate reaches zero, i.e. the moment when the wafer has just cleared the beam or vice versa. The detection of this moment by the detector is then used to initiate a subsequent operation in the ion implanter and may be used particularly advantageously to, for example, initiate reversal of the scan or initiate recordal of ion beam parameters such as beam current for dosimetry measurements and beam stability measurements.

In another aspect of the invention, the detector may be arranged to detect the moment at which the proportion of the beam cross-sectional area incident on a substrate reaches a maximum value which, under certain circumstances could provide an indication of when the ion beam is both incident on and just at the edge of the substrate. Preferably, the monitor comprises means for measuring beam current. Advantageously, the monitor may be arranged to measure the beam current not incident on the substrate, so that the monitor not only performs the primary function of monitoring changes in the proportion of the ion beam cross-sectional area incident on the substrate but also gives a direct measure of beam current for dosimetry calculations. Alternatively, the monitor may be arranged to monitor the beam current incident on the substrate. In other embodiments, the monitor may comprise any means which is sensitive to the presence of the ion beam and which is sensitive to changes in the beam cross-sectional area incident thereon.

Figure 2:
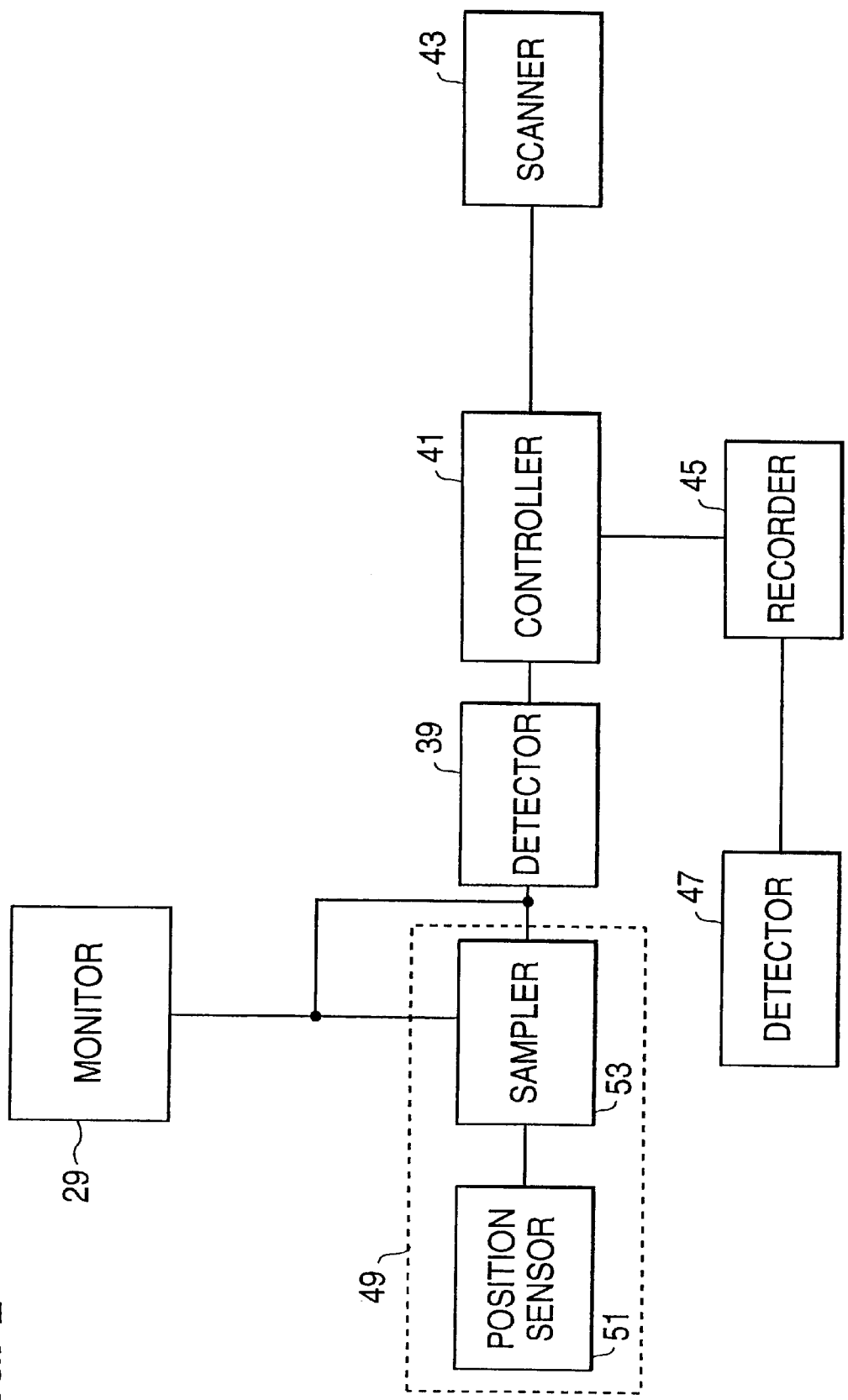
FIG. 2 is a block diagram showing an embodiment of a scan detection apparatus.

An embodiment of an apparatus for detecting the moment when the ion beam is just fully clear of a target substrate is shown in FIG. 2. The apparatus comprises a monitor 29 for monitoring changes in the proportion of beam cross-sectional area incident on the target substrate as the beam passes over the edge of the substrate. The monitor 29 may, for example, be arranged to monitor ion beam current, and may be arranged to monitor ion beam current which is either incident or not incident on the target substrate. The monitor 29 may generate an output signal indicating the magnitude of the sensed beam current. A detector 39 is coupled to the output of the monitor 29 for detecting the moment when the cross-sectional area incident on the substrate reaches zero as the beam traverses the edge of the substrate. If the monitor 29 is arranged to monitor beam current not incident on the target substrate, the moment when the proportion of beam cross-sectional area incident on the substrate reaches zero may be signified by the monitored beam current reaching a maximum value. Thus, the detector may be arranged to detect the moment when the monitored beam current reaches this maximum value.

Alternatively, if the monitor 29 is arranged to monitor beam current incident on the target substrate, the moment at which the proportion of beam current incident on the substrate reaches zero could be signified by the monitored beam current reaching zero or a minimum value. In this case, the detector 39 would be arranged to detect the moment when the monitored beam current reaches such a value.

On detecting the moment when the beam current incident on a target substrate reaches zero, the detector 39 generates an output signal which may be used to control or initiate a further process in the ion implanter. In the particular embodiment shown in FIG. 2 a controller 41 is connected to the output of the detector 39 for controlling both scanning and the recording of various ion beam parameters, such as beam current and beam stability. Thus, a scan driver 43 and a recorder 45 are both operatively coupled to the controller 41. The recorder 45 receives measurements from one or more detectors 47 for measuring parameters in the ion implanter and may include the monitor 29.

The principles embodied in the apparatus shown in FIG. 2 may be applied to any ion implanter which employs scanning, including ion implanters which scan by deflecting the ion beam relative to a stationary or moving target substrate or those which scan the substrate relative to a stationary ion beam.

Referring again to FIG. 2, the apparatus may optionally further comprise gating means 49 for gating the output signal from the monitor 29 so that the detector 39 receives the signal output from the monitor 29 on a less than continuous basis. The frequency of the gating may be controlled by other parameters in the ion implanter.

In one embodiment, the gating means 49 comprises a position sensor 51 for sensing the position of a target substrate relative to a reference position and a sampler 53 for sampling the output of the monitor 29 in response to an output signal from the position sensor 51 indicating that a target substrate is in or has reached a predetermined position. This embodiment may advantageously be incorporated in an ion implanter in which the target substrate is mechanically scanned through the beam and in particular an ion implanter in which a target substrate is mechanically scanned through the beam relatively quickly along a first predetermined path and relatively slowly along a second predetermined path, for example in the radially scanned, spinning wheel or disk arrangement shown in FIG. 1. The way in which the apparatus of FIG. 2 may be employed in such an ion implanter is described below with reference to FIGS. 3 to 15.

In the particular embodiment, the scanner comprises a wheel 11 which can rotate at relatively high speed about its central axis 21, mounted on a scanning arm 19 which translates the wheel 11 through an arc at relatively low speed. A plurality of circular semiconductor wafers 14 are mounted around the circumference of the wheel 11 and are successively and cyclically introduced into the ion beam as the wheel 11 rotates. At the same time, the semiconductor wafers 14 are scanned radially through the ion beam by the scanning arm 19 which moves the wheel 11 back and forth along an arc.

At the beginning of an implant process, the scanning arm 19 is at a position such that the wheel 11 is fully clear of the ion beam 4 and the wheel 11 is accelerated until it reaches the correct rotational speed, selected, for example, in accordance with the required implant dose. The scanning arm 19 is then accelerated to the initial inward radial scanning velocity required when the ion beam just impinges on the outer edges 16 of the wafers 14. It will be appreciated that for a uniform implant dosage across the wafers 14, the radial scanning velocity must be increased by a factor which is proportional to the inverse distance between the ion beam and the rotary axis 21 of the wheel 11 so that the ion dose for a given single radial scan through the ion beam is independent of the position of the wheel 11 in the radial scan.

After the wafers 14 have been passed right through to the other side of the ion beam 4, the scanning arm 19 decelerates, reverses direction and accelerates to the initial outward radial scanning velocity appropriate to the ion beam striking the inner edges 18 of the wafers 14. The wafers 14 are scanned right through the beam 4 from their inner edges 18 to their outer edges 16 again, at a velocity which may vary, i.e. decrease so that the implant dose is uniform across the wafers 14. After the wheel 11 is completely clear of the ion beam 4, the wheel 11 is decelerated in the radial scan, its direction is reversed and the wheel 11 is again accelerated to the correct initial inward radial scanning velocity for a third pass through the beam 4. The radial scan progresses back and forth as described above until the desired implant dose is reached.

Figure 4:
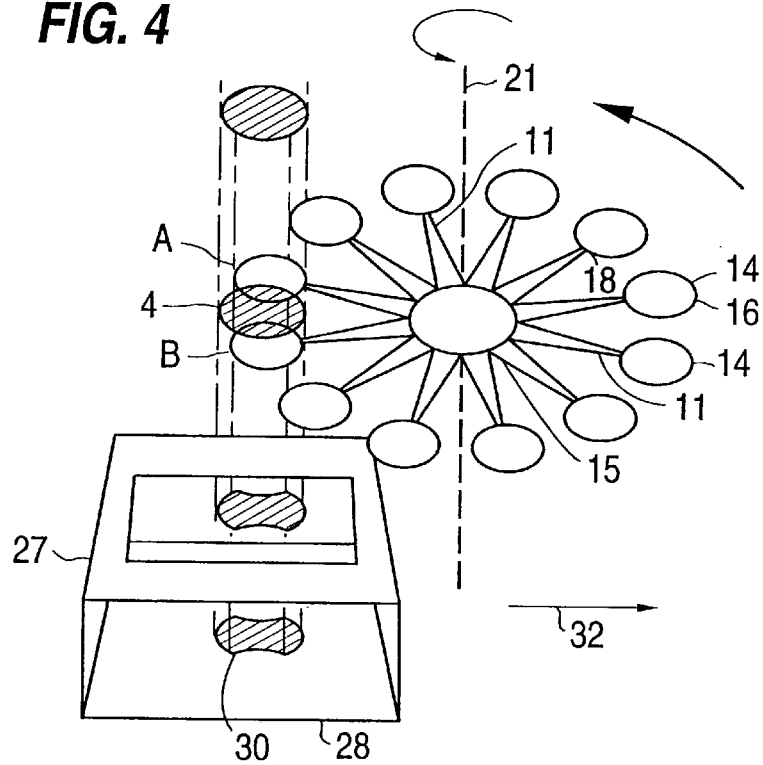
FIG. 4 shows a schematic perspective view of the arrangement shown in FIG. 3.

Referring to FIGS. 3 and 4, a Faraday bucket 27 is positioned downstream of the wafers 14 to collect all of the beam current which is not intercepted by the target wafers 14.

FIGS. 3 to 6 illustrate an example of how the apparatus of FIG. 2 can be employed to measure and record the full beam current before the wheel 11 has cleared the ion beam 4. FIGS. 3 and 4 show a position of the wheel 11 in the rotary scan at which the ion beam 4 is about midway between two adjacent wafer substrates A,B. The wheel position in the radial scan is such that the wafer substrates A,B are about halfway through the radial scan. The adjacent substrates A,B are spaced apart by a minimum distance of less than the maximum dimension across the ion beam 4 as measured in the same direction as the minimum distance, so that in this scan position, part of the ion beam impinges on both adjacent substrates A,B simultaneously, with the ion beam 4 impinging on the lower part of the upper wafer A and the upper part of the lower wafer B, as indicated by the hatched areas 20,22, shown in FIG. 3. The proportion of the ion beam cross-sectional area which flows through the gap between the adjacent wafers A,B and impinges on the back 28 (beam stop) of the Faraday bucket 27 is shown as the hatched area 30 in FIG. 4. The Faraday bucket 27 will output a current indicative of the proportion of beam current not incident on the target substrates. For the same position of the target substrates A,B in the rotary scan, the shape of the gap between adjacent substrates through which the ion beam can flow varies as the wheel is translated through the radial scan, and the beam current impinging on the back 30 of the Faraday bucket 27 varies accordingly. As the wheel 11 moves through the radial scan out of the ion beam 4, e.g. to the right as indicated by the arrow 32 in FIG. 4, for the same position in the rotary scan, the wheel 11 eventually reaches a position in the radial scan at which the ion beam 4 is just off both edges 24 of two adjacent wafers A,B and the full ion beam is collected by the Faraday bucket 27.

Referring to FIG. 2, the detector 39 can be arranged to detect the moment when the proportion of the beam cross-sectional area incident simultaneously on two adjacent substrates A,B, reaches zero, whereupon the controller 41 controls the recorder 45 to record the beam current collected by the Faraday bucket 27. In one embodiment, the beam current monitored by the Faraday bucket 27 may be sampled only when the wafer substrates 14 are at a particular position in the rotary scan as monitored by the position sensor 51. In particular, the beam current signal delivered to the detector 39 may be synchronised with the rotary scan position at which two selected target substrates A,B are adjacent and as substantially equidistant from the centre of the ion beam, as shown in FIGS. 3 to 6. The beam current signal from the monitor may be sampled once or more or less than once per revolution of the wheel.

Advantageously, detecting the time or times at which no part of the ion beam is incident on the target substrates even though the wheel is still in the ion beam allows the full beam current to be recorded for dosimetry measurements before the wheel leaves the beam. Furthermore, if there is a sufficient time interval between the moment when all of the ion beam can be "seen" by the Faraday bucket and the moment when the wheel just fully clears the ion beam, a plurality of full beam current measurements can be made providing a measure of ion beam stability. For example, the full beam current may be sampled at other positions in the rotary scan, e.g. between other substrates during one revolution of the wheel and the beam current may be sampled between only some or all of the substrates. Thus, beam parameters such as ion dose and stability can be measured before the end of each scan so that the time needed for making such measurements can be eliminated from the period over which the wheel is clear of the beam during scan reversal, so shortening the scan reversal time and increasing beam utilisation efficiency.

It is to be noted that for the particular geometry shown in FIGS. 3 to 6, in which the beam cross-section and wafers are circular, the selected rotary scan position is the one at which the full beam current can first be detected by the Faraday cup 27 as the wheel travels along the radial scan. In other words, this rotary scan position provides the earliest opportunity to measure and record the full beam current during the radial scan. In general, the rotary scan position at which the beam current is monitored should preferably be chosen so that the full beam current can be received at the earliest opportunity during the radial scan, although the optimum rotary position may differ for different beam and substrate geometries.

Figure 6:
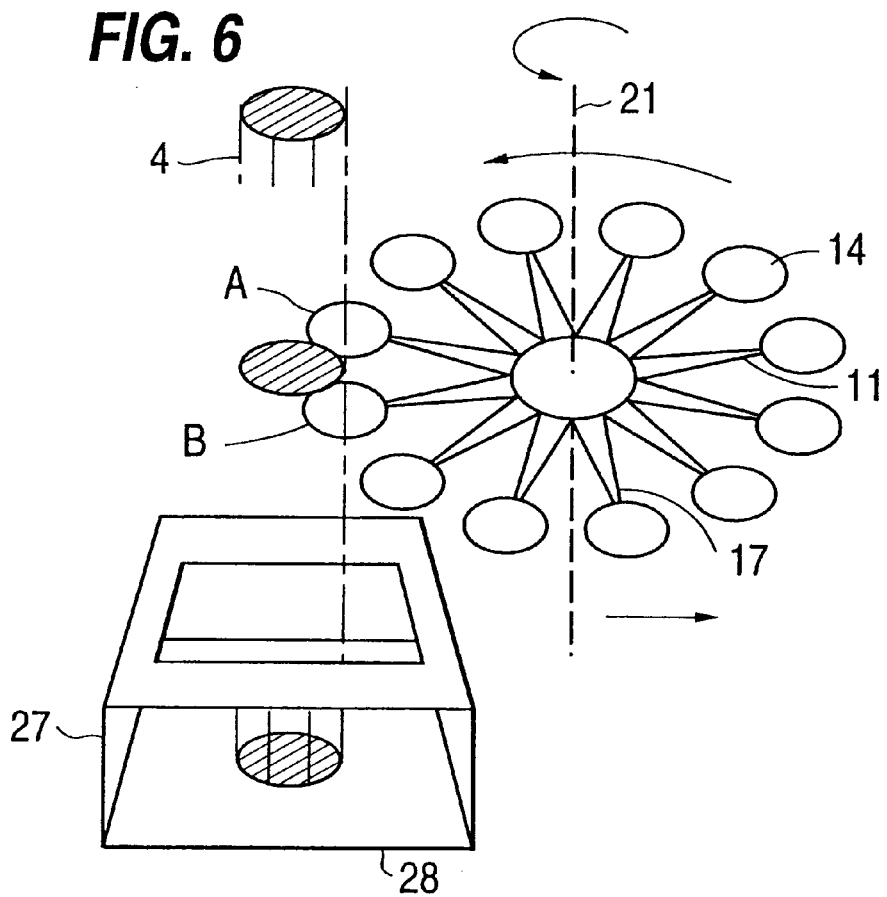
FIG. 6 shows a schematic perspective view of the scanning position shown in FIG. 5.
Figure 7:
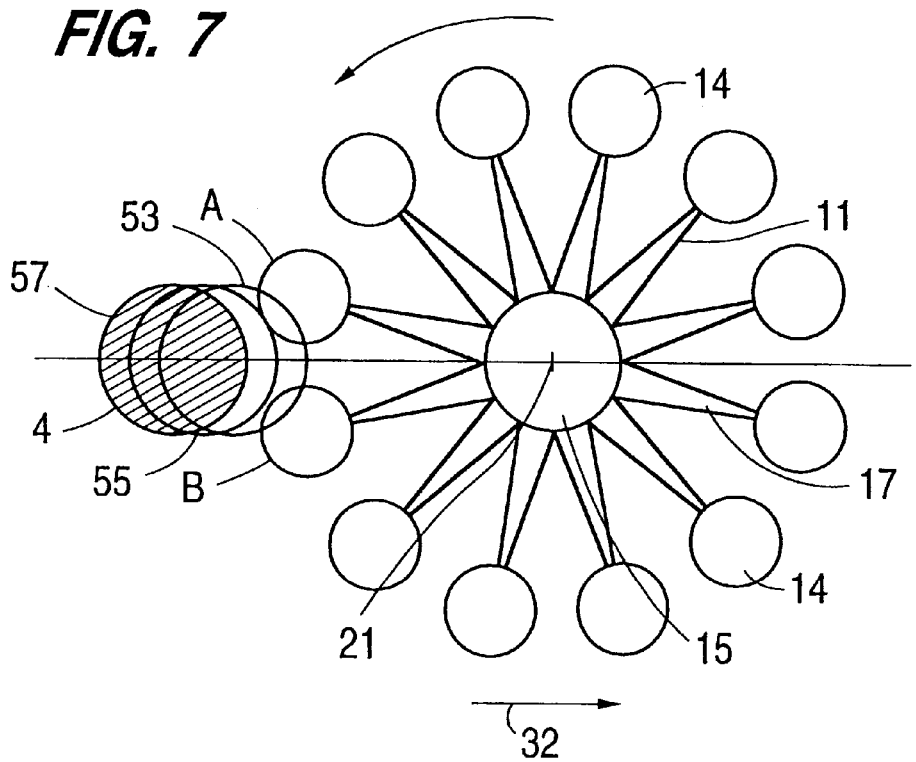
FIG. 7 shows three different horizontal scanning position of the spoked wheel scanning arrangement relative to the beam line.
Figure 8:
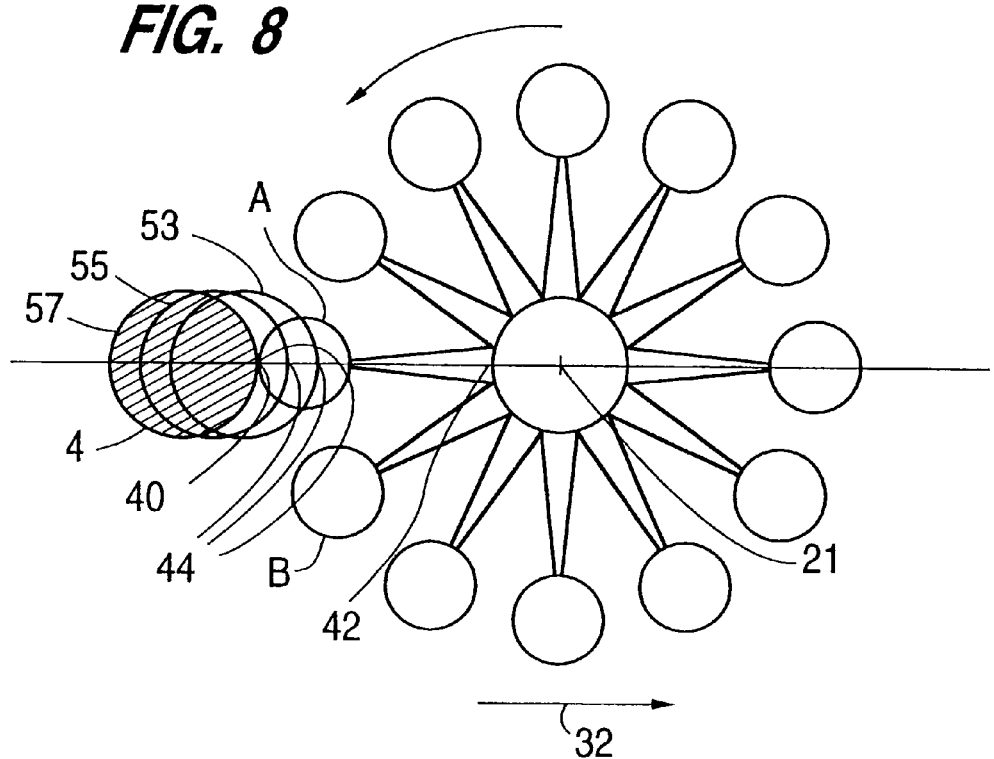
FIG. 8 shows a different orientation of the spoked wheel arrangement shown in FIG. 7.

FIGS. 7 and 8 illustrate how the apparatus of FIG. 2 can be used to detect the moment when the wheel just clears the beam at the end of the outward radial scan. FIGS. 7 and 8 show three different positions of the wheel relative to the ion beam in the radial scan, for two different positions in the rotary scan. FIG. 7 shows a position in the rotary scan at which two adjacent wafers A, B lie either side of and are spaced equally from the beam centre line as shown in FIGS. 3 to 6, and FIG. 8 shows a rotary scan position at which a single wafer A is nearest the beam line axis. In this example, the beam cross-section is larger than the wafer size, although in practice the beam cross-section is usually smaller than the wafer.

Figure 5:
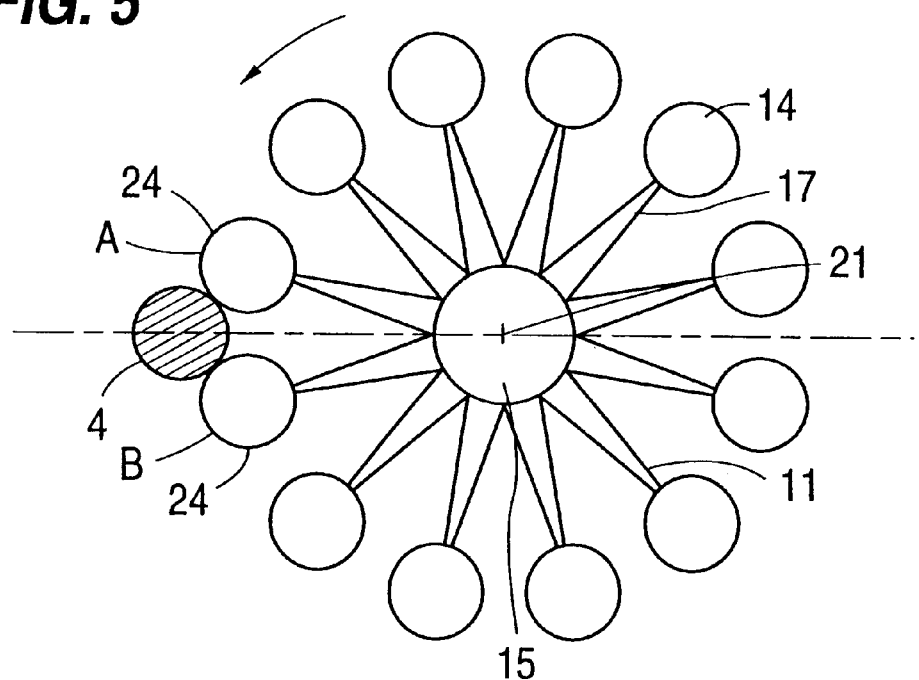
FIG. 5 shows the front view of the scanning arrangement shown in FIG. 3 with the ion beam tangential to the edges of two adjacent target substrates.

Referring to FIG. 7, as the wheel 11 moves to the right as indicated by the arrow 32, the wheel 11 is translated along the radial scan from a position 53 at which the ion beam impinges two adjacent wafers simultaneously, to an intermediate position 55 at which the two adjacent wafers A, B are just out of the ion beam, which corresponds to the position shown in FIGS. 5 and 6 at which the full beam current may be measured and recorded.

Referring to FIG. 8 as the wheel 11 is translated to the right through the radial scan, the wafer A nearest the beam axis moves from a position 53 at which the ion beam 4 is substantially incident on the wafer A, through an intermediate position 55 corresponding to the intermediate radial scan position 55 shown in FIG. 7 (at which the full beam current can be detected by the Faraday cup), to a position 57 at which the wafer A nearest the ion beam 4 is just clear of the beam.

The apparatus shown in FIG. 2 may be arranged to detect the moment at which the wheel just clears the ion beam, for example by monitoring the beam current incident on the Faraday bucket 27 and detecting the moment when the ion beam current reaches a maximum value independent of the rotary scan position. Alternatively, the gate 49 may be used such that the beam current from the Faraday bucket 27 is sampled only at a position in the rotary scan at which a single wafer is nearest the ion beam and preferably at which the extreme point 40 on the outer edge 16 of the wafer A lies on a radius 42 of the wheel 11 extending to the nearest point 44 on the edge of the ion beam from the wheel axis 21, as shown in FIG. 8, to ensure that as soon as the beam current reaches a maximum value, the wafers can be said to be fully clear of the beam. The controller 41 can then initiate reversal of the scan in response to a signal from the detector 39 indicating that the wheel has just cleared the beam. Thus, the apparatus actively detects the moment when the wheel is actually clear of the beam irrespective of the shape or width of the ion beam cross-section so that the moment when the scan direction can be reversed can be accurately determined and the scan reversal time minimized. Alternatively, the beam current measurements at both rotary scan positions shown in FIGS. 7 and 8 can be used to detect the moment when the wheel just clears the beam, as described below, with reference to FIGS. 13 and 15.

Figure 9:
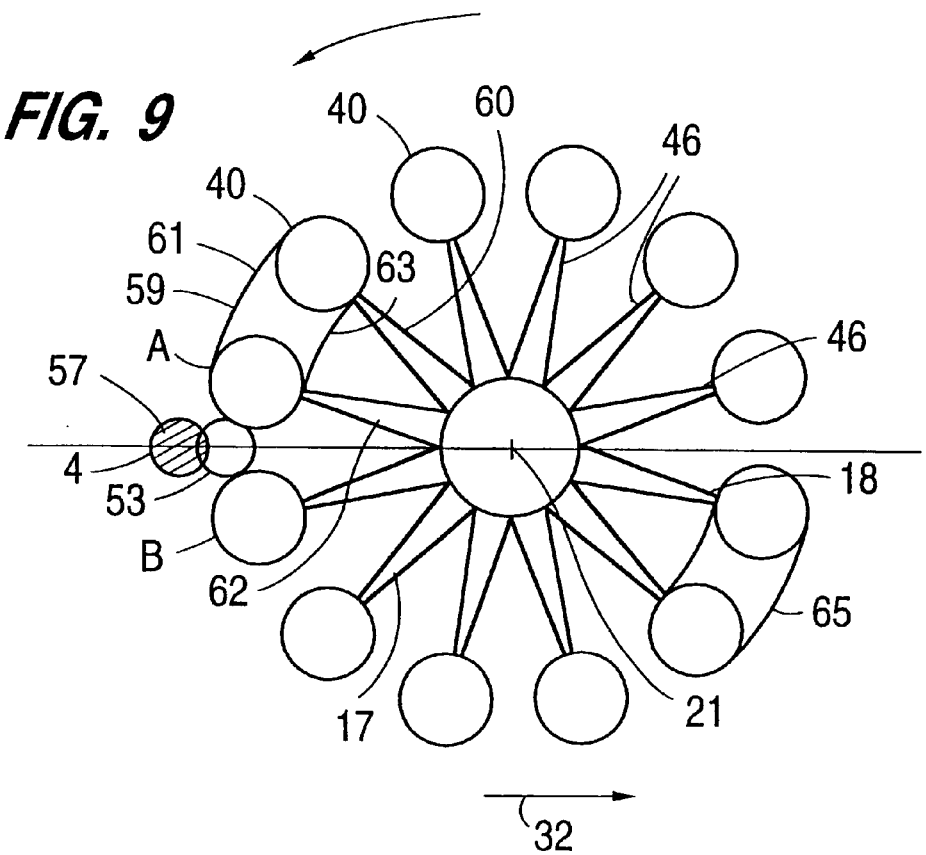
FIG. 9 shows another embodiment of the spoked wheel scanning arrangement.
Figure 10:
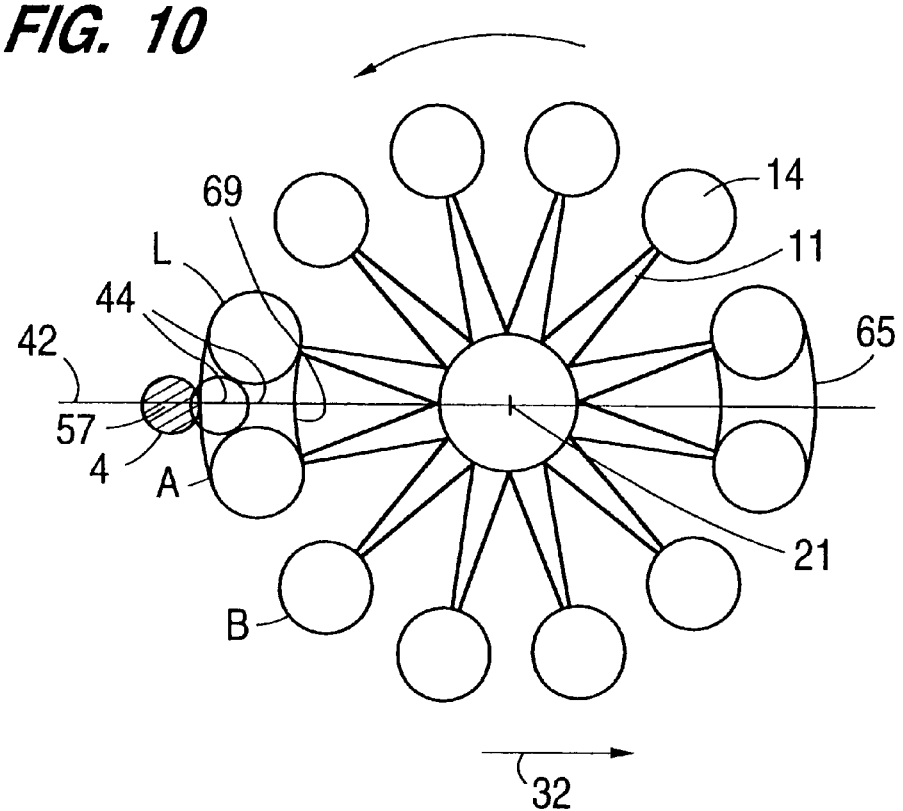
FIG. 10 shows the spoked wheel arrangement of FIG. 9 oriented to a different position in the scan.

FIGS. 9 and 10 show another embodiment of a wheel for carrying a plurality of substrates which is modified to assist in detecting the moment when the wheel just clears the beam at the end of an outward radial scan and to allow detection of the moment when the inner edges of the wafers just clear the beam during the inward radial scan. In this embodiment, the wheel includes a mask 59 positioned between two adjacent spokes 60,62 having an outside edge 61 which lies on the locus described by the extreme points 40 on the outer edges 16 of the wafers 14 as the wheel is rotated about its rotational axis 21. Similarly, the mask 59 has an inner edge 63 which lies on the locus described by the inwardmost points 46 on the inner edges 18 of the wafers 14 as the wheel is rotated about its rotational axis 21.

FIG. 9 shows two positions of the wheel 11 in the radial scan for a position in the rotary scan at which two adjacent wafers A,B lie either side of the ion beam 4. As the wheel 11 travels along the outward radial scan, the wheel 11 reaches a first position 53 at which the full ion beam passes between two adjacent wafers A, B although the wheel is still within the beam. This position 53 corresponds to the position shown in FIGS. 5 and 6 at which the full beam current can first be measured.

FIG. 10 also shows two different positions of the wheel 11 in the radial scan but for a position in the rotary scan at which the mask 59 lies on the wheel radius 42 adjoining the point 44 on the edge of the ion beam 4 nearest the wheel axis 21. The apparatus of FIG. 2 can detect the moment when the wheel 11 just clears the beam by monitoring the beam current at one or more positions in the rotary scan at which the mask 59 is nearest the ion beam or lies on the shortest wheel radius 42 adjoining the edge of the ion beam 4. The mask 59 serves effectively to increase the length of the extreme outer edge of the wafer along the circular path described by the wafers as the wheel rotates so that the rotary position at which the beam current is monitored as the mask passes through the ion beam is not too critical and the ion beam current collected by the Faraday cup remains constant over a longer period of time to provide sharp, well-defined beam current minima as the wheel rotates. Furthermore, although the edges of the wafers preferably protrude beyond the edges of their respective carriers as shown in FIG. 1, the carriers may have a clamping arrangement or simple buffer positioned beyond the edges of the wafers at radial extremities of the wheel so that the extreme outside edge of the circular path described by the wheel is defined not by the edge of the wafers, but by the clamping or buffer arrangement. In this case, as the mask defines the actual outside edge of the wafers, the moment when the wafers just clear the beam can still be accurately determined by monitoring the beam current in the 'mask' position, rather than a 'wafer' position (i.e. where the mask rather than a wafer is nearest the ion beam).

One or more additional masks 65 may be added between other spokes 19 so that the beam current can be monitored in other rotary positions to detect the moment when the wheel fully clears the ion beam. In the embodiment shown in FIGS. 9 and 10, one further mask 65 is optionally added diametrically opposite the first mask 59, which also serves to balance the wheel 11. However, preferably the area of the masks over the wheel is kept to a minimum to avoid possible contamination of the ion beam with mask material. Accordingly, preferably only one mask is used and the wheel balanced by modifying the wheel without increasing the surface area of the wheel near the wafers.

Figure 11:
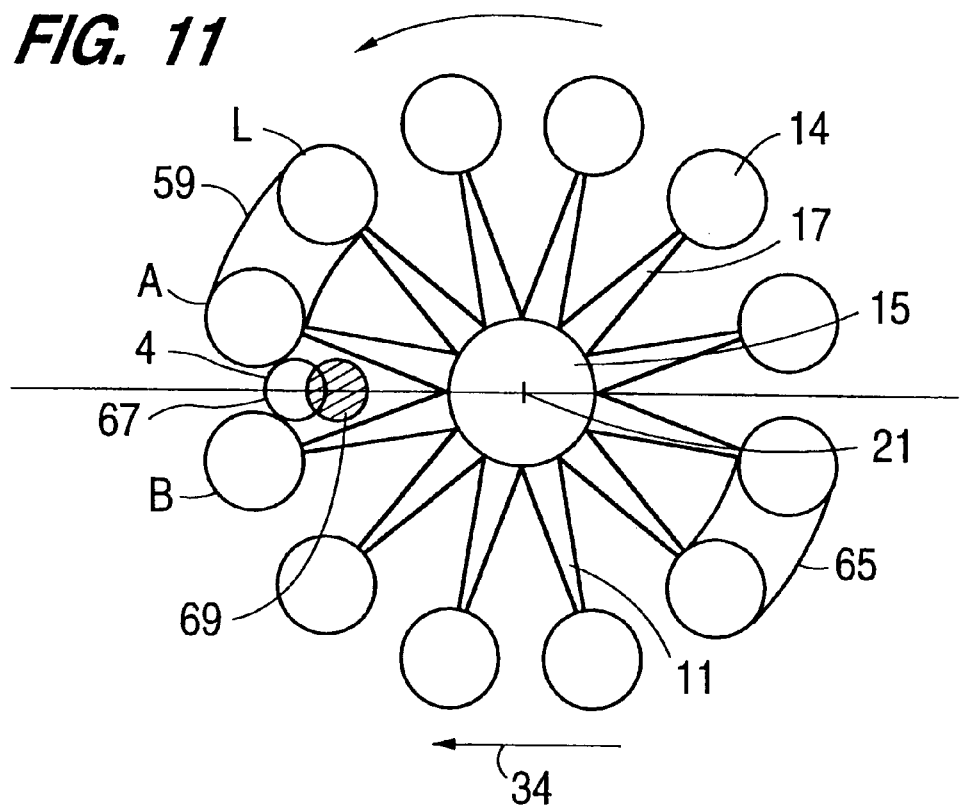
FIG. 11 shows a front view of the spoked wheel arrangement shown in FIG. 9 in two different positions relative to the beam line.
Figure 12:
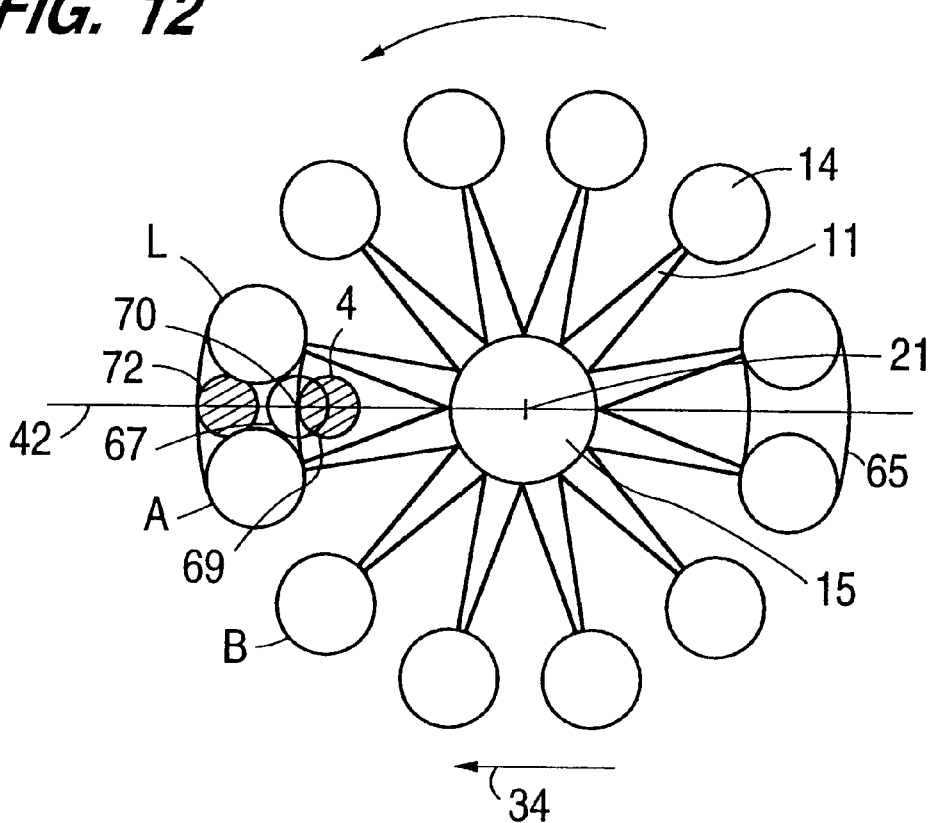
FIG. 12 shows the spoked wheel arrangement of FIG. 11 rotated to another position relative to the beam line.

FIGS. 11 and 12 illustrate the wheel 11 at various positions in the radial scan as the wheel 11 moves inwardly into and through the ion beam with the rotational axis 21 of the wheel 11 moving towards the ion beam 4 to the left as indicated by the arrow 34. In the arrangement shown in FIGS. 11 and 12, the beam cross-sectional area is small enough, and the space between two adjacent spokes is large enough to accommodate the full ion beam cross-sectional area. As the wheel moves through the radial scan to the left, a position 67 is reached where at a position in the rotary scan, where the ion beam lies substantially midway between two wafers A, B, as shown in FIG. 11, the ion beam is just off the edges of both wafers A, B and the full beam current impinges on the Faraday bucket 27. The detection apparatus of FIG. 2 can detect the moment at which, for the rotary scan position shown in FIG. 11, the proportion of beam cross-sectional area incident simultaneously on two adjacent wafers A, B reaches zero, so that the full ion beam current can be measured and recorded before the inner edges 18 of the wafers 14 have fully cleared the beam. Of course, if the ion beam cross-section is too large to pass between the spokes, it will not be possible to detect simultaneously the full beam current.

FIG. 12 illustrates how the mask 59 is used to detect the moment when the inner edges 18 of the wafers 14 just clear the beam. As the wheel 11 continues to travel through the ion beam along the inward radial scan, the wheel 11 reaches a position 69, at which the inner edge 63 of the mask 59 just clears the ion beam 4, with the full ion beam passing between two adjacent spokes. The moment at which the proportion of beam cross-sectional area incident on the wafers reaches zero is signified by the beam current measured on the Faraday bucket 27 reaching a maximum value. The detection apparatus of FIG. 2 may sample the beam current on the Faraday detector at a position in the rotary scan at which the mask 59 is nearest the ion beam 4 or lies on the wheel radius 42 adjoining the outermost point 70 on the edge of the beam, as, for example shown in FIG. 12.

Alternatively, the moment at which the wheel 11 reaches a position in the inward radial scan at which the inner edges 18 of the wafers 14 just clear the beam 4 can be measured by detecting the moment when the outer edge 72 of the ion beam coincides with the outer edge 61 of the mask 59, by detecting the moment when the beam current incident on the Faraday bucket 27 reaches zero. As the time taken for the wheel 11 to travel along the inward radial scan by a distance equal to the width of the wafer can be calculated from the kinematics of the wheel in the radial scan, the moment when the inner edges of the wafers just clear the edge of the beam can be predicted. However, the accuracy of this method relies on certain assumptions about the diameter of the wafers and kinematic parameters describing the velocity and acceleration of the wheel along the radial scan, which could introduce errors. Accordingly, the direct detection method described above is preferred.

Figure 13:
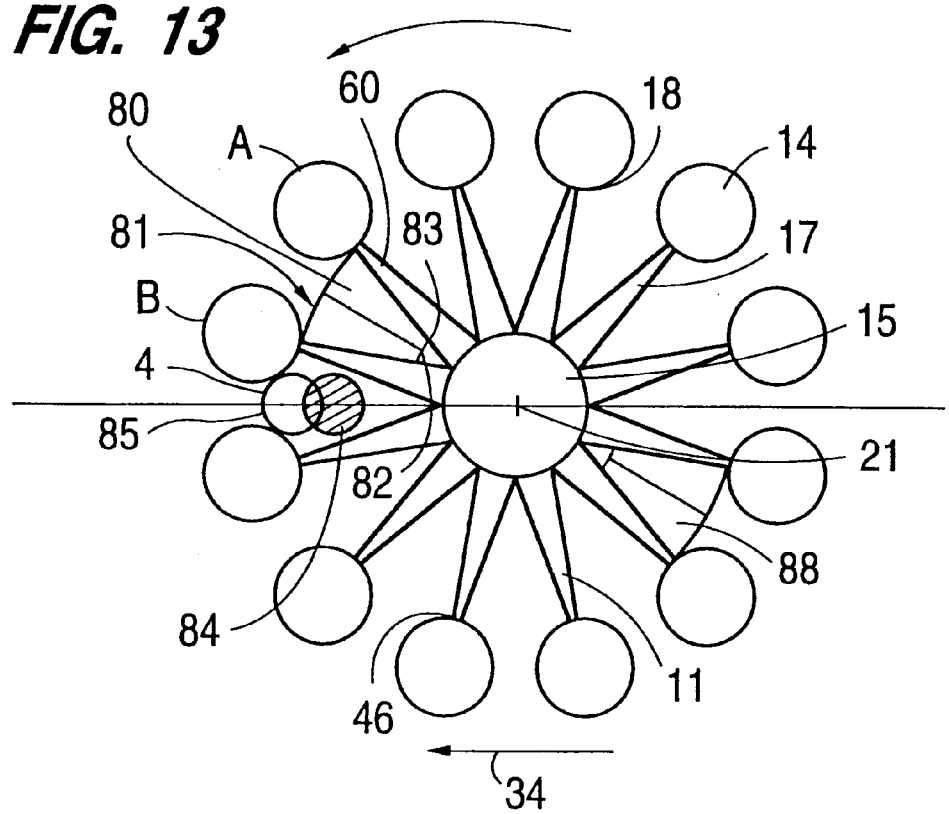
FIG. 13 shows another embodiment of the spoked wheel scanning arrangement.
Figure 14:
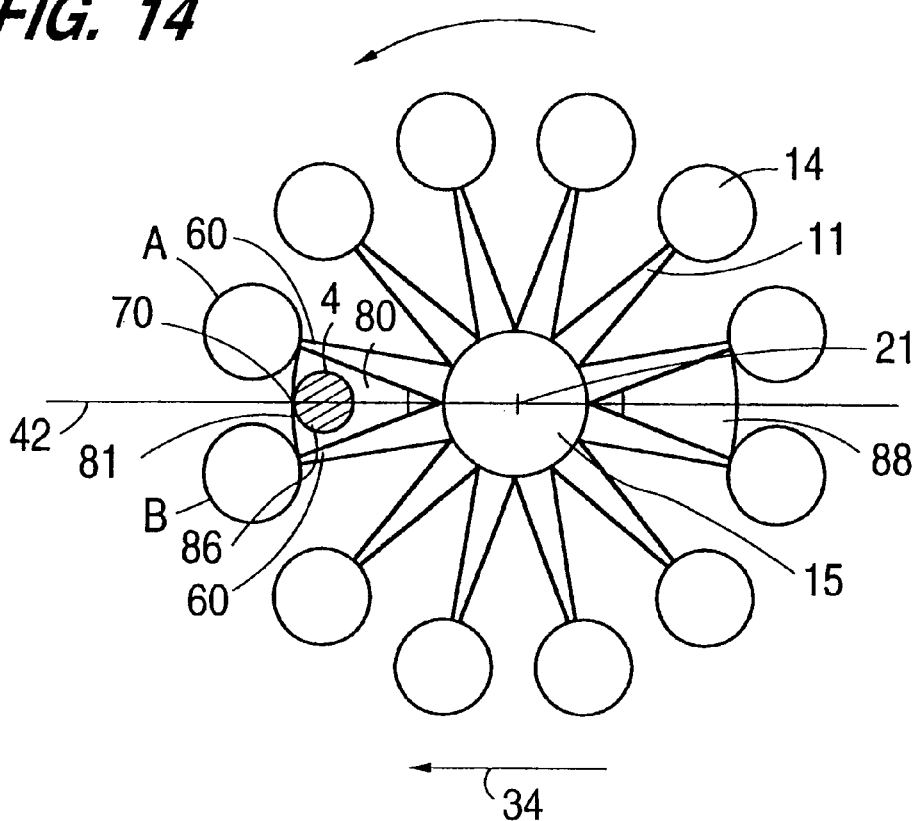
FIG. 14 shows the spoked wheel arrangement of FIG. 13 oriented to a further position in the scan.
Figure 15:
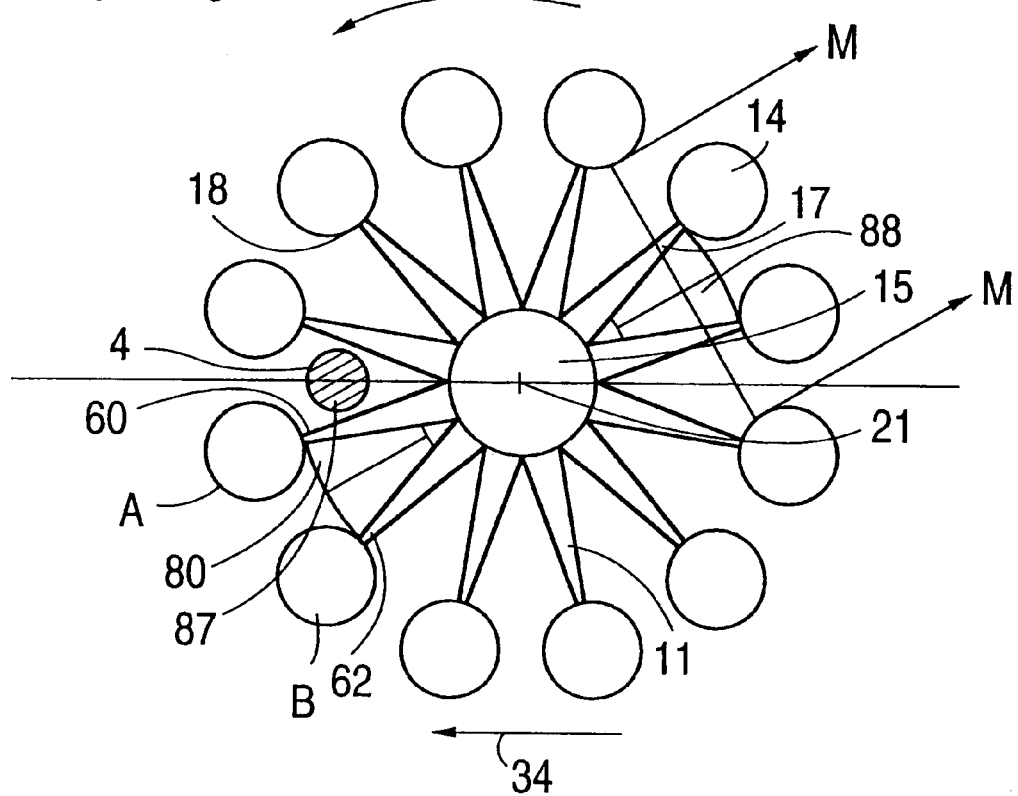
FIG. 15 shows the spoked wheel arrangement of FIG. 13 oriented to a further position in the scan.

FIGS. 13, 14 and 15 show another embodiment of a wheel for carrying a plurality of substrates which is modified to assist in detecting the moment when the inner edges of the wafers just clear the beam during the inward radial scan. In this embodiment, the wheel includes a mask 80 located closer to the central hub 15. Specifically, the mask 80 is positioned between two adjacent spokes 60,62 having an outside edge 81 which lies on the locus described by the inward most points 46 on the inner edges 18 of the wafers 14 as the wheel is rotated about its rotational axis 21. The outside edge of the mask 80 may extend from each inward most point 46 on the inner edges 18 of the wafers such that any point along the outside edge is equidistant from the centre of the central hub 15, i.e., rotational axis 21. In other words, the outside edge 81 of the mask 80 lies along the shortest wheel radius 42. The mask 80 has an inner edge 82 which lies on the locus that may be described by the central hub 15. The inner edge of the mask may lie on the locus described by mask mounting points 83 on the two adjacent spokes 60,62 as the wheel is rotated about its rotational axis 21. Locating the mask 80 closer to the rotational axis 21 of the wheel decreases the moment of inertia of the process wheel, enabling faster spin up/down times, thus, increasing processing throughput. Furthermore, placement of the mask 80 between the central hub 15 and the radius of the inner edges of the wafers, reduces the amount of time the ion beam is incident the mask, thus reducing contamination of substrates during processing due to sputtering of the mask.

Figure 16:
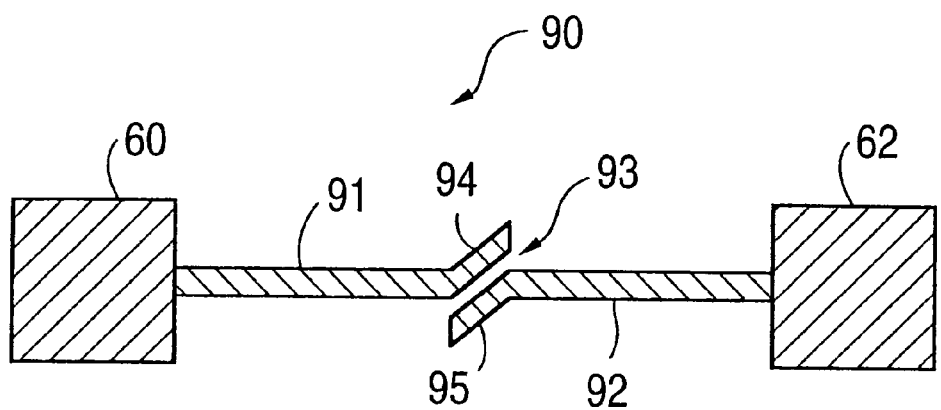
FIG. 16 shows a cross-sectional view of the mask of the spoked wheel arrangement taken along line M—M of FIG. 15.

FIG. 16 shows a cross-sectional view of the mask 88 taken along line M—M of the spoked wheel arrangement of FIG. 15. FIG. 16 shows an aspect of the mask 88 having a split arrangement 90. The mask 88 having the split arrangement 90 may comprise a first mask section 91 affixed to the spoke 60 and a second mask section 92 affixed to the adjacent spoke 62. The first mask section 91 is oriented relative to the second mask section 92 such that a split 93 is formed between overlapping and underlapping portions 94,95 of the mask sections 91,92. As depicted in FIG. 16, the split arrangement of the mask 88 is oriented such that the first overlapping portion 94 of the first mask section 91 screens the underlapping portion 95 of the second mask section 92 from the ion beam 4. In this embodiment, the split formed between the overlapping and underlapping portions radially extends centrally relative to and between the adjacent spokes from the inner edge 82 to the outside edge 81 of the mask 80 in the split mask arrangement. The split arrangement in the mask 80 is selected to decrease stresses between wheel components, such as the spokes, hub, and the mask, due to thermal expansion.

Typically, the material of the mask of either mask embodiment 80 and 59 is a metal such as aluminum, and the like, having a coating such as silicon, and the like. Similarly, as discussed with respect to the other mask 59 arrangement, one or more additional masks 88 may be added between other spokes 19 so that the beam current can be monitored in other rotary positions to detect the moment when the wheel fully clears the ion beam. In the embodiment shown in FIGS. 13, 14 and 15, one further mask 88 is optionally added diametrically opposite the first mask 80, which also serves to balance the wheel 11. Factors in determining placement of the additional masks 88 include minimizing the area of the masks over the wheel to avoid possible contamination of the ion beam with mask material, and balancing the wheel by modifying the wheel without increasing the surface area of the wheel near the wafers.

Furthermore, although the edges of the wafers preferably protrude beyond the edges of their respective carriers as shown in FIG. 1, the carriers may have a clamping arrangement or simple buffer positioned beyond the edges of the wafers at radial extremities of the wheel so that the extreme outside edge of the circular path described by the wheel is defined not by the edge of the wafers, but by the clamping or buffer arrangement. In this case, as the mask defines the actual outside edge of the wafers, the moment when the wafers just clear the beam can still be accurately determined by monitoring the beam current in the 'mask' position, rather than a 'wafer' position (i.e. where the mask rather than a wafer is nearest the ion beam).

FIGS. 13, 14 and 15 illustrate the wheel 11 at various positions in the radial scan as the wheel 11 moves inwardly into and through the ion beam with the rotational axis 21 of the wheel 11 moving towards the ion beam 4 to the left as indicated by the arrow 34. In the arrangement shown in FIGS. 13, 14 and 15, the beam cross-sectional area is small enough, and the space between two adjacent spokes without the mask 80 affixed, e.g., between adjacent spokes 84 and 60, is large enough to accommodate the full ion beam cross-sectional area. As the wheel moves through the radial scan to the left, a position 85 is reached where at a position in the rotary scan, where the ion beam lies substantially midway between two wafers A, B, as shown in FIG. 13, the ion beam is just off the edges of both wafers A, B and the full beam current impinges on the Faraday bucket 27. The detection apparatus of FIG. 2 can detect the moment at which, for the rotary scan position shown in FIG. 13, the proportion of beam cross-sectional area incident simultaneously on two adjacent wafers A, B reaches zero, so that the full ion beam current can be measured and recorded before the inner edges 18 of the wafers 14 have fully cleared the beam. Of course, if the ion beam cross-section is too large to pass between the spokes, it will not be possible to detect simultaneously the full beam current.

FIG. 14 illustrates how the mask 80 is used to detect the moment when the inner edges 18 of the wafers 14 just clear the beam. As the wheel 11 continues to travel through the ion beam along the inward radial scan, the wheel 11 reaches a position 86, at which the ion beam fully clears the outside edge 81 of the mask 80 such that the mask just fully receives the ion beam 4. More specifically, the moment when an outermost point 70 on the edge of the cross-section of the ion beam 4 incident on outside edge 81 of the mask, is the moment at which the cross-sectional area incident on the mask is maximum. This moment is signified by the beam current measured on the Faraday bucket 27 reaching a zero value when the ion beam cross-sectional area incident on the mask reaches maximum. As the wheel 11 continues to travel through the ion beam along the inward radial scan, the wheel reaches a position 87 where the proportion of beam cross-sectional area incident on the mask reaches zero and the proportion of beam cross-sectional area passing between adjacent spokes with out a mask is maximum, as shown in FIG. 15. The detection apparatus of FIG. 2 samples the beam current on the Faraday detector at a such a position 87 in the rotary scan at which the outermost point 70 on the edge of the beam fully clears the inward most points 46 on the inner edges 18 of the wafers 14 as the wheel is rotated about its rotational axis 21. By detecting the moment when the beam current incident on the Faraday bucket 27 reaches zero at positions such as 86 and maximum at positions such as 87, the inward radial scan is complete and the scan reversal at maximum scan is triggered.

In either embodiment of the mask, the moment when the ion beam just clears the inward most edges of the wafers may be measured irrespective of beam size, even if the ion beam is too large to pass between pairs of adjacent spokes. This may be achieved by comparing beam monitor output signals for two different positions in the rotary scan, one being at a position where the mask is nearest the beam, and another being at a position where, for example a gap between adjacent wafers is nearest the beamline, as will be described below.

Figure 17:
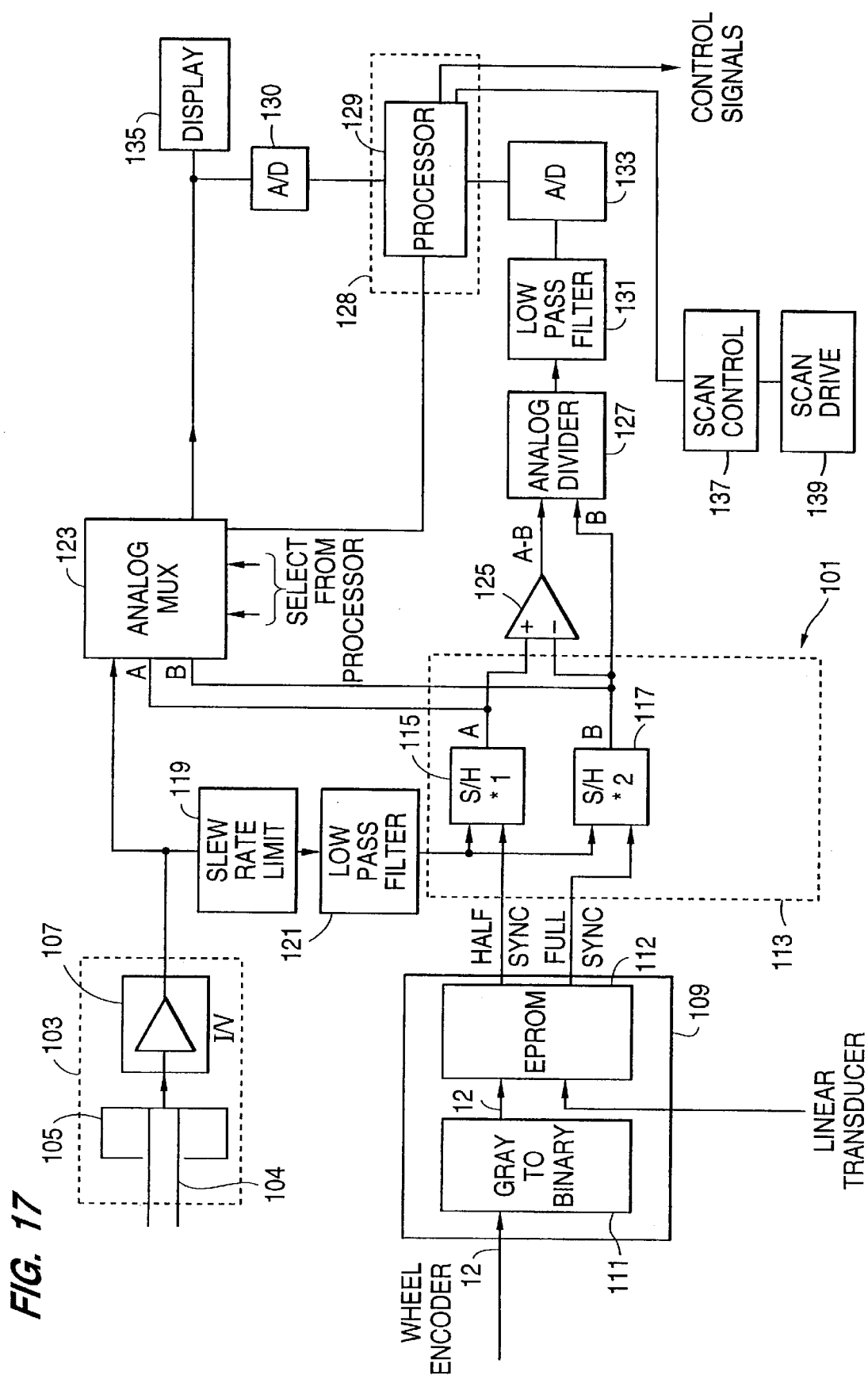
FIG. 17 shows a block circuit diagram of an embodiment of a monitoring circuit.

FIG. 17 shows an embodiment of the detection apparatus of FIG. 2, specifically designed for the mechanical scanning apparatus described above. The apparatus 101 comprises a monitor 103 for monitoring beam current comprising a Faraday bucket 105 connected to a current converter 107 for converting the current output from the Faraday bucket 105 into a voltage output. A position sensor 109 for sensing the position of a point on the wheel 11 relative to a fixed reference point (e.g. a point on the ion beam cross-section) comprises a wheel encoder (not shown) for generating an output signal corresponding to the angular position of the wheel 11. The wheel encoder may for example comprise an optical position sensor or a resolver, which generates an analogue or digital signal indicating the angular position of the wheel. In one embodiment, the wheel encoder comprises an array of light sources, e.g. LED's and an opposed array of photodetectors and an opposed array of photodetectors for detecting light from the light sources and which are both fixed in a stationary position relative to the wheel 11. An optically encoded disk is arranged to rotate with the wheel and pass between the array of light sources and photodetectors as the wheel rotates. As the wheel 11 rotates, selected photodetectors receive light depending on the position of the optically encoded disk and generate a digital code, for example a Gray scale code. The code is fed to a binary converter 111, which converts the Gray or other code to binary code, e.g. 12 to 16 bit, indicating the wheel position relative to the scan arm 19. The binary converter 111 may also allow the binary code to be offset so that the code can be calibrated to a particular wheel position.

As the wheel 11 travels through the radial scan between the extreme scan positions, the scanning arm sweeps through an arc typically of about 20° so that the position of the wheel relative to a fixed reference point, such as the ion beam, is not only dependent on the angular position of the wheel relative to the scanning arm but also on the position of the scanning arm itself. Therefore, in determining the precise position of a point on the wheel relative to a fixed reference point, the position of the scanning arm must also be taken into account. The scanning arm position is measured by a position sensor which generates a signal indicating the position of the arm relative to a fixed reference point. The position sensor 109 further comprises an EPROM 112 which stores wheel position data in the form of look-up tables for a series of scan arm positions over the radial scan. The signal generated by the scanning arm position sensor is also fed to the EPROM 112, to select the appropriate look-up table for a given scan arm position. The EPROM 112 may be programmed to generate a signal for any wheel position relative to a fixed point.

In this embodiment, the beam current is sampled as the wheel travels through the radial scan for discrete positions of the wafers in the rotary scan, relative to the ion beam. In the rotary wheel scanning apparatus, in order to detect the moment when the beam current incident simultaneously on two adjacent wafers first reaches zero in the radial scan so that the full beam current can be measured before the end of a radial scan, the beam current is sampled at a position in the rotary scan where the beam axis lies midway between two adjacent wafers as shown in FIGS. 3 to 6. For the purposes of determining the moment when the extreme outer edges of the wafers have just cleared the beam for initiating scan reversal, the beam current may be monitored at a position in the rotary scan at which a single wafer is nearest the ion beam or the extreme outer edge of a single wafer lies on the wheel radius which intersects the point at the edge of the ion beam nearest to the wheel's rotational axis 21, as shown in FIG. 8. Alternatively, in embodiments in which the wheel includes a mask 59 located between adjacent spokes and placed at the same radius of the wafers which defines the extreme inner and outer edges of the wafers, the beam current may be monitored in a position in the rotary scan in which the mask 59 is nearest the ion beam or intersects the shortest wheel radius adjoining the edge of the beam, as shown in FIG. 10. This latter position of the mask in the rotary scan is also used for determining the moment when the extreme inner edges of the wafers just clear the beam, as shown in FIG. 12. In embodiments in which the wheel includes a mask 80 positioned between the central hub 15 and the inner edges of the wafers and in between adjacent spokes, which defines the extreme inner edges of the wafers, the beam current may be monitored in a position in the rotary scan in which the mask 80 is nearest the ion beam and for determining the amount when the extreme inner edges of the wafer just clear the beam, as shown in FIGS. 13, 14, and 15.

Returning to FIG. 17, the EPROM 112 is programmed to generate an output signal at a position in the rotary scan at which two selected adjacent wafers nearest the beam lie either side of the beam line by a substantially equal distance, which will be referred to as the 'half sync' signal, and another signal corresponding to another position in the rotary scan at which either a selected wafer or a mask, between adjacent spokes, lies nearest the ion beam or on the shortest wheel radius connected to a point on the edge of the ion beam, which will be referred to as the 'full sync' signal.

A sampler 113 comprises two sample-and-hold devices 115 and 117. The output of the current converter 107 is connected to the inputs of each sample-and-hold devices 115, 117 via a slew rate limiter 119 and a low pass filter 121 which suppress or eliminate unwanted high frequency components from the beam current signal. One of the sample-and-hold devices 115 is connected to the half sync signal output of the EPROM 112 and the other sample-and-hold circuit 117 is connected to the full sync signal output of the EPROM 112. The sample-and-hold devices 115, 117 sample the beam current signal from the current converter 107 in response to the half and full sync control signals from the EPROM 112 and output respective signals A, B corresponding to the beam current amplitude at the aforementioned rotary scan positions. A multiplexer 123, either analogue or digital, receives the output signals A, B from the sample-and-hold devices 115, 117 and also directly receives the raw (i.e. unfiltered) output signal from the current converter 107. The beam current signals A, B from the sample and hold devices 115, 117 are also fed to the inputs of a differential amplifier 125 which generates a difference signal (A−B). The difference signal and the instantaneous beam current signal B at full sync position from the sample and hold circuit 117 are supplied to the inputs of an analog divider 127 in which the difference signal (A−B) is normalised by the beam current signal B at full sync position so that the resulting signal is independent of the absolute beam current amplitude. Thus, the output of the divider represents the percentage or fractional difference between the two sample positions and is independent of beam level. The output from the analog divider 127 is supplied to a detector 128, comprising processor 129, via a low pass filter 131 and an analogue-to-digital converter 133 which may for example be an 8-bit A/D converter. The raw beam current, and signals A, B at half and full sync positions are also fed to the processor 129 from the multiplexer via an A/D converter 130. The output from the multiplexer is controlled by the processor 129. The processor 129 is programmed to detect the moment when the full beam current is first detected in the radial scan and to control the recording of certain ion beam parameters in response to that moment being detected, and also to detect the moment when the inner and outer edges of the wafers just clear the beam in both the inward and outward radial scans and to control scan reversal in response thereto, as will be described in more detail below. The processor may generate and send a signal to a scan controller 137 on detecting the end of a radial scan, to control a scan driver 139 to reverse the scan. The processor 129 may also generate other signals to control other devices at the end of a radial scan. The raw beam current signal from the current converter 107, the instantaneous beam current signals A, B at half and full sync positions, via the multiplexer 123, and the normalised difference signal (A−B)/B from the analog divider 127 may be supplied to a visual display 135 such as a cathode-ray-oscilloscope (CRO) so that the signals can be monitored directly.

Figure 18:
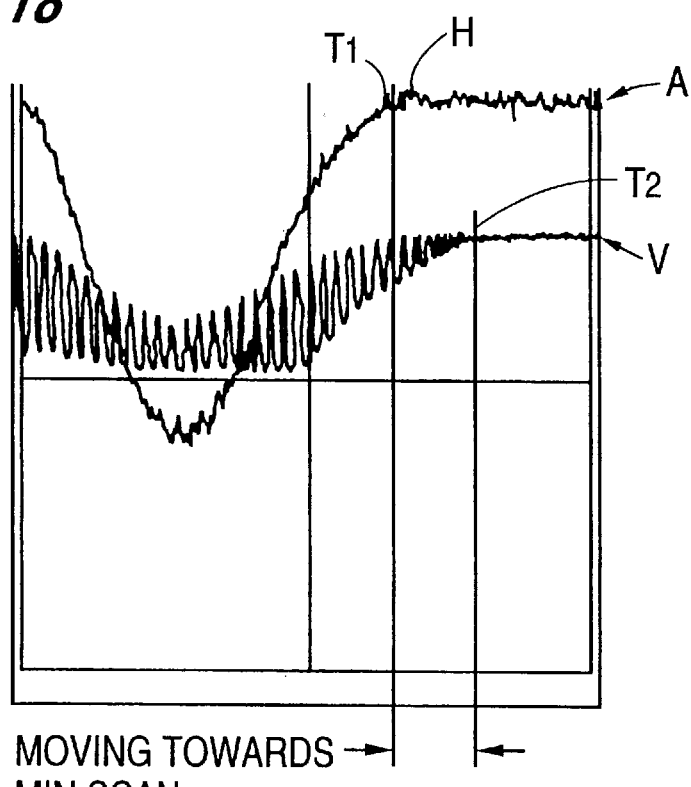
FIG. 18 is a graph showing the variation in the output of the monitoring circuit of FIG. 17 when sampling the beam current between two adjacent target substrates.

FIG. 18 shows an oscilloscope trace H of the instantaneous beam current signal A measured at the half sync rotary scan position as the wheel moves outwardly along the radial scan. FIG. 18 also shows a trace V of the output of the raw beam current signal from the current converter 107, which is monitored simultaneously. The left-hand side of the traces H,V correspond to a position in the radial scan at which the ion beam is adjacent the inner edges of the wafers, and the right-hand side of the traces H,V correspond to a position in the radial scan at which the ion beam is near the outer edges of the wafers. Referring to the trace H of the half sync position beam current, the beam current impinging on the Faraday bucket 27 steadily decreases to a minimum value as the area of the gap between the two selected adjacent wafers through which the ion beam passes also approaches a minimum as the wheel travels through the radial scan. The half sync beam current signal then steadily increases as the gap between the wafers through which the ion beam passes becomes larger as the wheel moves out of the beam, until the beam current signal reaches a maximum value at a time $T_1$, which corresponds to the moment when the full beam current can first be seen through the gap between two adjacent wafers as the wheel comes out of the ion beam, and which corresponds to the situation shown, for example in FIGS. 5 and 6, and the intermediate position 55 as shown in FIG. 7, at which the edges of the two adjacent wafers nearest to the ion beam are just off the edge of the beam.

Trace V represents the variation in beam current signal measured by the Faraday bucket as modulated by the wafer substrates as they travel through both the rotary and radial scans. The high frequency modulation is caused by the wafers moving through the rotary scan, with the peak amplitudes corresponding to the maximum beam current for a given position in the radial scan i.e. when the beam line is midway between two wafers. Accordingly, these peaks correspond to points on the half sync position trace H. On the other hand, the high frequency minima correspond to positions in the rotary scan at which, for a given position in the radial scan, the proportion of beam cross-sectional area incident on the wafers is a maximum, which generally corresponds to a position at which a given wafer is nearest to or in line with the ion beam. As the wheel travels outwardly through the radial scan, the modulated beam current passes through a minimum and then increases to a steady maximum which is reached at time $T_2$. This corresponds to the moment when the wheel just clears the edge of the ion beam as indicated, for example, by position 57 in FIGS. 7, 8, 9 and 10.

In the specific example shown in FIG. 18, the moment $T_1$ at which the full beam current can first be measured between two adjacent wafers occurs 0.43 seconds before the moment $T_2$ when the wheel fully clears the ion beam. The moment $T_1$ at which the beam current reaches a maximum value, indicating that the full beam current is momentarily incident on the Faraday bucket, is detected by the processor 129 shown in FIG. 17 which initiates recording of the beam current for dosimetry measurements. During the time interval between $T_1$ and $T_2$, a plurality of beam current measurements may be taken either once or more or less than once per revolution of the wheel and used to determine beam stability. The recording of the various beam parameters and ion dosage can be recorded in the time interval between $T_1$ and $T_2$ so that the measurements are recorded before the wheel clears the beam and the time taken to record these measurements does not form part of the time needed for scan reversal.

Figure 19:
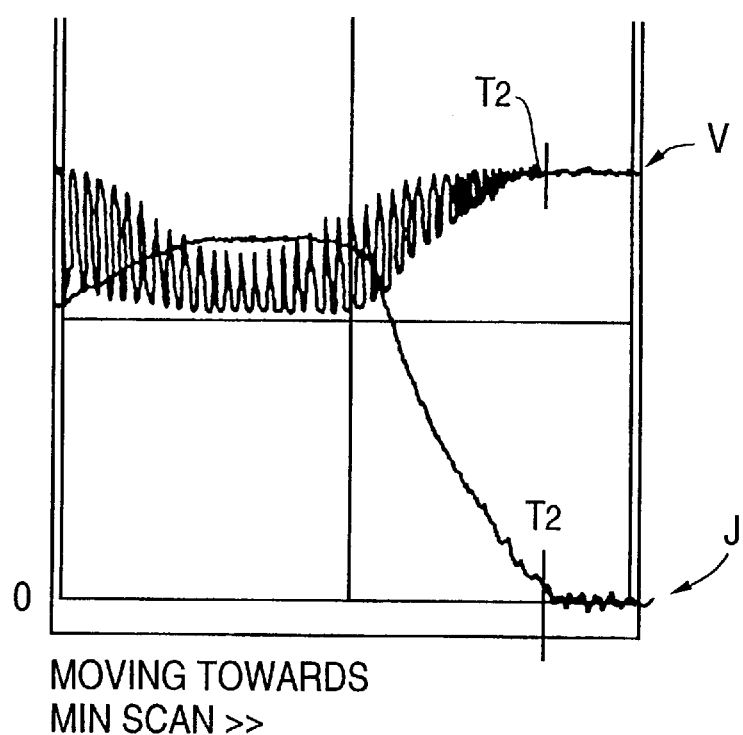
FIG. 19 shows the differential output of the circuit of FIG. 17 of the beam current sampled at two positions in the scan.

FIG. 19 shows a trace of the normalised difference signal (A–B)/B from the analog divider 127, as the wheel travels outwardly through the radial scan from a position at which the beam is adjacent the inner edges of the wafers to a position at which the wheel is clear of the beam. The raw beam current signal at the output of the current converter 107 is also shown for comparison. As the wheel moves through the radial scan such that the beam traverses the outer edges of the wafers, the normalised difference signal decreases steadily to zero which is reached at a time $T_2$, indicating that the wheel has just cleared the beam. The moment when the wheel just clears the beam can also be seen from the trace V of the continuously sampled beam current and from the current converter 107 when the signal reaches a steady maximum. The normalised difference signal (A–B)/B is passed to the processor 129 which compares the difference signal with a predefined value such as ½%, depending on the resolution of the difference signal. As soon as the difference signal reaches or decreases to below the predefined value (indicating that the wheel has just cleared the beam), the processor generates and sends a control signal to the scan driver to initiate scan reversal. The scan driver responds by immediately decelerating, reversing and accelerating the scanning arm to the desired initial velocity so that the scan turn-around time is minimized.

The moment at which the inner edges of the wafers just clear the ion beam at the other end of the scan may also be measured using the normalised difference signal. In this case, the beam current signal A is sampled at the half sync position, for example shown in FIG. 11 and the beam current signal B is derived by sampling the beam current when the wheel is positioned with the mask 59 nearest to or in line with the ion beam, as, for example shown in FIG. 12. The beam current signal A sampled at the half sync position shown in FIG. 11, will reach a maximum value before the beam current signal B, sampled at the full sync position shown in FIG. 12. However, the difference between the two signals A, B decreases as the inner edge of the mask 59 moves inwardly through the ion beam to the right, until the inner edge of the mask just clears the edge of the wafer, at which point both synchronised beam current signals A,B are equal and the difference is zero. Again, the moment when the difference signal reaches zero as the wheel travels inwardly along the radial scan is detected by the processor 129 which generates and sends an appropriate signal to the scan drive to reverse the scan. Alternatively, when implementing mask 80, as shown in FIGS. 13, 14 and 15, the appropriate signal to the scan drive to reverse the scan is sent when the processor detects the half sync beam current falling to zero, specifically, the moment when the ion beam is occluded by the mask 80 upon the inner edges of the wafer clearing the beam.

Although the ion beam cross-section and spacing between adjacent spokes shown in FIGS. 11 and 12, and FIGS. 13, 14 and 15, is sufficient to allow the full ion beam current to flow through the wheel to the Faraday bucket, the difference signal can be used to detect the moment when the inner edges of the wafers just clear the beam at the end of the inward scan irrespective of beam size. For example, if the beam cross-section is sufficiently large that there is no position in the inward radial scan in which the full beam current can flow through the wheel, part of the beam current will always impinge on one or more spokes. However, as long as the area of the gap between the spokes through which the ion beam can pass is the same between two different pairs of spokes for a position in the radial scan at which the inner edge of the mask is just off the ion beam, the difference signal will decrease to zero when this condition is reached.

As mentioned above, if the ion beam cross-section is sufficiently small so as to be accommodated between the spokes before the inner edges of the wafers have fully cleared the ion beam in the inward radial scan, the beam parameters can be measured and recorded before the end of the inward scan by the apparatus shown in FIG. 17 as described above in relation to measuring beam parameters during the outward scan In other embodiments, the moment at which the beam just fully clears a target substrate may be measured by monitoring beam current maxima or minima and comparing the values of the maxima and minima with predefined values or comparing the amplitudes of successive maxima and/or minima until, for example the amplitudes do not change or do not change outside predefined limits.

Other embodiments may comprise different means for scanning the wafers relative to the ion beam, for example the wafers may be introduced into the ion beam along a linear path and the ion beam deflected across the linear path by electrostatic or magnetic means. Alternatively, wafers may be processed on an individual basis with the ion beam being scanned over the wafer in two dimensions, again by electrostatic or magnetic deflection means.

As changes in the beam cross-sectional area incident the substrate(s) are measured directly, the scan detection apparatus can be used for target substrates of any shape or size e.g. circular, square, rectangular as well as other shapes and with charged particle beams of any cross-sectional area or shape, e.g. circular, elliptical, rectangular, square as well as other geometries.

Further modifications to the embodiments described herein will be apparent to those skilled in the art.

We claim:

1. An ion implanter for implanting ions into a substrate, comprising an ion beam generator for generating a beam of ions, support means for carrying a substrate to be implanted with beam ions, scanning means for scanning at least one of said substrate and said ion beam relative to the other so that said beam traverses said substrate along a predetermined path, monitoring means arranged to monitor changes in the proportion of the ion beam cross-sectional area incident on said substrate as the ion beam traverses the edge of said substrate from a position in the scan at which said proportion is finite to a position at which said proportion is zero, detection means responsive to said monitoring means for detecting the moment when said proportion reaches zero from a finite value as the ion beam and/or substrate moves along said predetermined path, and operative means responsive to said detection means detecting said moment for performing an operation in said ion implanter.

2. An ion implanter as claimed in claim 1, wherein said monitoring means comprises means for monitoring ion beam current.

3. An ion implanter as claimed in claim 1, wherein said monitoring means is arranged to sample at least a portion of said ion beam cross-section not incident on said substrate.

4. An ion implanter as claimed in claim 1, wherein said monitoring means is arranged to sample substantially all of the ion beam cross-section substantially simultaneously at said moment.

5. An ion implanter as claimed in claim 1, comprising measuring means for measuring the value of a parameter of said ion beam and wherein said operative means comprises recording means arranged to record the value of said parameter in response to said detection means detecting said moment.

6. An ion implanter as claimed in claim 1, wherein said operative means comprises control means arranged to control a change in the direction of said scan in response to said detection means detecting said moment.

7. An ion implanter as claimed in claim 1, wherein said monitoring means includes sensing means for sensing the ion beam current flowing through said substrate.

8. An ion implanter as claimed in claim 1 further comprising detection means for detecting the moment when said proportion reaches a maximum value as the ion beam and/or substrate moves along said predetermined path and wherein said operative means is responsive to said detection means detecting the moment when said proportion reaches a maximum or other predetermined value for performing a subsequent operation in said ion implanter.

9. An ion implanter as claimed in claim 8 further comprising predictive means for predicting the value of a parameter at which said proportion will reach zero based on the value of that parameter at the moment at which said proportion reaches a maximum or other predetermined value, means for sensing said parameter, and wherein said operative means is responsive to said sensing means sensing said predicted value to perform a subsequent operation in said ion implanter.

10. An ion implanter as claimed in claim 9, wherein said parameter comprises at least one of (i) the position of said ion beam, (ii) the position of said substrate, (iii) the velocity of said ion beam, (iv) the velocity of said substrate, (v) the rate of change of velocity of said ion beam, (vi) the rate of change of velocity of said substrate, (vii) the time.

11. An ion implanter as claimed in claim 10, wherein said operative means comprises recording means for recording the value of a parameter of said ion beam in response to said sensing means sensing said predicted value.

12. An ion implanter as claimed in claim 10, wherein said operative means comprises control means for controlling a change in the direction of said scan in response to said position sensing means sensing said predicted value.

13. An ion implanter comprising an ion beam generator for generating a beam of ions, support means adapted to carry a plurality of substrates, adjacent substrates being spaced apart by a minimum distance of less than the maximum distance across said ion beam cross-section as measured in the same direction as said minimum distance, scanning means for scanning at least one of said plurality of substrates and said ion beam relative to the other along a first predetermined path, said support means being adapted to introduce successively said substrates into said ion beam along a second predetermined path different from said first predetermined path, monitoring means adapted to monitor changes in the proportion of ion beam cross-sectional area incident simultaneously on two adjacent substrates moving through said ion beam, and detection means arranged to detect the moment when said proportion reaches zero as the ion beam traverses said substrates from a position in the scan at which said beam is incident on two adjacent substrates simultaneously.

14. An ion implanter as claimed in claim 13, wherein said monitoring means comprises means for monitoring ion beam current.

15. An ion implanter as claimed in claim 14, wherein said monitoring means is arranged to sample at least a portion of said ion beam cross-section not incident on said substrates.

16. An ion implanter as claimed in claim 15, wherein said monitoring means is arranged to sample substantially all of the ion beam cross-section substantially simultaneously at said moment.

17. An ion implanter as claimed in claim 13, further comprising operative means responsive to said detection means detecting said moment for performing a subsequent operation in said ion implanter.

18. An ion implanter as claimed in claim 17, further comprising measuring means for measuring the value of a parameter of said ion beam and wherein said operative means comprises recording means arranged to record the value of said parameter in response to said detection means detecting said moment.

19. An ion implanter as claimed in claim 18, wherein said measuring means is arranged to sample the full beam cross-section at least once in the period when said proportion is zero as the ion beam traverses from one substrate to an adjacent substrate as said substrates move along said second predetermined path.

20. An ion implanter as claimed in claim 18, wherein said recording means is arranged to record the value of said parameter after said moment and before the value of said proportion both reaches zero and becomes independent of the position of said substrates on said second predetermined path as the ion beam and/or the substrates are scanned along said first predetermined path.

21. An ion implanter as claimed in claim 18, wherein said recording means comprises an electronic memory.

22. An ion implanter as claimed in claim 13, further comprising position sensing means for sensing the position of said substrates on said second predetermined path, and wherein said monitoring means is arranged to sample said proportion in response to said position sensing means sensing that a substrate has reached a predetermined position on said second predetermined path.

23. An ion implanter as claimed in claim 22, wherein said monitoring means is arranged to sample said proportion when two adjacent substrates are positioned on opposite sides of said ion beam such that said proportion has a substantially minimum value for a given position on said first predetermined path.

24. An ion implanter comprising an ion beam generator for generating a beam of ions, support means adapted to carry a plurality of substrates, scanning means for scanning at least one of said plurality of substrates and said ion beam relative to the other along a first predetermined path, said support means being adapted to introduce successively said substrates into said ion beam along a second predetermined path different from said first predetermined path, monitoring means adapted to monitor changes in the proportion of ion beam cross-sectional area incident on the path described by the substrates moving along said second predetermined path, and detection means arranged to detect the moment when said proportion reaches zero as the ion beam traverses said path from a position in the scan at which said beam is incident on said path.

25. An ion implanter as claimed in claim 24, wherein said monitoring means comprises means for monitoring ion beam current.

26. An ion implanter as claimed in claim 25, wherein said monitoring means is arranged to sample at least a portion of said beam cross-section not incident on said path.

27. An ion implanter as claimed in claim 26, wherein said monitoring means is arranged to sample substantially all of the ion beam cross-section substantially simultaneously at said moment.

28. An ion implanter as claimed in claim 24, further comprising operative means responsive to said detection means detecting said moment for performing a subsequent operation in said ion implanter.

29. An ion implanter as claimed in claim 28, wherein said operative means comprises control means arranged to control a change in the direction of said scan in response to said detection means detecting said moment.

30. An ion implanter as claimed claim 24, further comprising masking means disposed between said ion beam generator and said monitoring means for blocking said ion beam and defining at least one of the two edges of the path described by said substrates moving along said second predetermined path.

31. An ion implanter as claimed in claim 30, wherein said masking means is arranged between two adjacent substrates and to move in phase with said substrates along said second predetermined path.

32. An ion implanter as claimed in claim 31, wherein said support means comprises a rotary wheel having a central hub and a plurality of discreet, spaced apart substrate carriers extending radially therefrom, and wherein said masking means is disposed in the gap between two adjacent substrate carriers.

33. An ion implanter as claimed claim 30, further comprising position sensing means for sensing the position of said masking means on said second predetermined path, and wherein said monitoring means is arranged to sample said proportion in response to said position sensing means sensing that said masking means is at a position on said second predetermined path substantially closest to said ion beam.

34. An ion implanter as claimed in claim 30, wherein said monitoring means is arranged to generate a signal indicative of the proportion of beam cross-sectional area not incident on said substrates or said masking means and to sample said proportion at a first position at which said masking means is substantially closest to said ion beam and at a second position on said second predetermined path at which two adjacent substrates are positioned on opposite sides of said ion beam and wherein said detection means is arranged to detect the moment when the signals generated by said monitoring means monitoring said proportion at said first and second positions become substantially equal.

35. The ion implanter as claimed in claim 30, wherein said masking means is located to block said ion beam beyond said one edge of the path by said substrates.

36. The ion implanter as claimed in claim 35, wherein said mask is arranged between two adjacent substrates and moves in phase with said substrates along said second predetermined path.

37. The ion implanter as claimed in claim 36, wherein said mask further comprises a first mask section and a second mask section, said first mask section positioned relative to said second mask section to form a slit between them.

38. The ion implanter as claimed in claim 37, wherein said first mask section comprises an overlap portion and said second mask section comprises an underlap portion, said overlap portion screening said underlap portion from the ion beam, said slit being formed between said overlap portion and said underlap portion.

39. The ion implanter as claimed in claim 35, wherein said support means comprises a rotary wheel having a central hub, radial spokes extending from the hub, and a plurality of discreet, spaced apart substrate carriers carried by said spokes, and said mask is disposed in the gap between two said spokes and has a radially outer edge along the radially inner edge of said path described by said substrates.

40. The ion implanter as claimed in claim 39 wherein said monitoring means monitors beam current passing through said wheel and said detection means is responsive to said monitored beam current falling to zero at a rotary position when the mask is closest to the beam, to provide an indication that the beam is just radially inside the inner edge of said path described by said substrates.

41. The ion implanter as claimed in claim 35, further comprising position sensing means for sensing the position of said mask on said second predetermined path, and said monitoring means is arranged to sample said proportion in response to said position sensing means sensing that said mask is at a position on said second predetermined path.

42. The ion implanter as claimed in claim 35, wherein said masking means is fabricated of aluminum and coated with silicon.

43. An ion implanter as claimed claim 24, further comprising position sensing means for sensing the position of a substrate on said second predetermined path, and wherein said monitoring means is arranged to sample said proportion in response to said position sensing means sensing that said substrate has reached a predetermined position on said second predetermined path.

44. An ion implanter as claimed in claim 43, wherein said monitoring means is arranged to sample said proportion at a position at which a single substrate is substantially closest to said ion beam.

45. An ion implanter as claimed in claim 24, wherein said monitoring means is arranged to generate a signal indicative of the proportion of beam cross-sectional area not incident on said substrates and to sample said proportion at a first position at which a single substrate on said second predetermined path is substantially closest to said ion beam and at a second position on said second predetermined path at which two adjacent substrates are positioned on opposite sides of said ion beam and wherein said detection means is arranged to detect the moment when the signals generated by said monitoring means monitoring said proportion at said first and second positions become substantially equal.

46. An ion implanter as claimed in claim 45 further comprising dividing means for dividing both signals generated at the two positions on said second predetermined path by one of said signals.

47. An ion implanter comprising an ion beam generator for generating a beam of ions, support means for carrying a substrate to be implanted with beam ions, scanning means for scanning at least one of said substrate and said ion beam relative to the other so that said beam traverses said substrate along a predetermined path, monitoring means arranged to monitor changes in the proportion of the ion beam cross-sectional area incident on said substrate as the ion beam traverses the edge of said substrate from a position in the scan at which said proportion is zero to a position at which said proportion is finite, detection means responsive to said monitoring means for detecting the moment when said proportion reaches a predetermined value from zero, and predictive means for predicting the value of a parameter at which said proportion will reach zero based on the value of that parameter at the moment at which said proportion reaches said predetermined value.

48. An ion implanter as claimed in claim 47, further comprising sensing means for sensing said parameter and operative means responsive to said sensing means sensing said predicted value for performing a subsequent operation in said ion implanter.

49. Apparatus for controlling an operation in an ion implanter, said ion implanter comprising an ion beam generator for generating a beam of ions, support means for carrying a substrate to be implanted with beam ions, and scanning means for scanning at least one of said substrate and said ion beam relative to the other so that said beam traverses said substrate along a predetermined path, said apparatus comprising monitoring means arranged to monitor changes in the proportion of the ion beam cross-sectional area incident on said substrate as the ion beam traverses the edge of said substrate from a position in the scan at which said proportion is finite to a position at which said proportion is zero, detection means responsive to said monitoring means for detecting the moment when said proportion reaches zero from a finite value as the ion beam and/or substrate moves along said predetermined path, and operative means responsive to said detection means detecting said moment for performing an operation in said ion implanter.

50. An ion implanter for implanting ions into a substrate, comprising an ion beam generator for generating a beam of ions, support means for carrying a substrate to be implanted with beam ions, scanning means for scanning at least one of said substrate and said ion beam relative to the other so that said beam traverses said substrate along a predetermined path, a monitor is arranged to monitor changes in the proportion of the ion beam cross-sectional area incident on said substrate as the ion beam traverses the edge of said substrate from a position in the scan at which said proportion is finite to a position at which said proportion is zero, a detector is responsive to said monitoring means for detecting the moment when said proportion reaches zero from a finite value as the ion beam and/or substrate moves along said predetermined path, and a controller responsive to said detection means detecting said moment for controlling an operation in said ion implanter.

51. A method as claimed in claim 50, wherein the step of controlling an operation comprises changing the direction of the scan.

52. A method as claimed in claim 50, wherein the step of controlling an operation comprises recording the value of a parameter of said ion beam.

53. A method of scanning in an ion implanter comprising the steps of generating a beam of ions and directing the ion beam towards a target substrate to be implanted with beam ions, scanning at least one of said substrate and said ion beam relative to the other so that the ion beam traverses the substrate along a predetermined path, monitoring changes in the proportion of the ion beam cross-sectional area incident on the substrate as the ion beam traverses the edge of the substrate from a position in the scan at which said proportion is finite to a position at which said proportion is zero, detecting the moment when a said proportion reaches zero from a finite value as the ion beam and/or substrate moves along said predetermined path, and controlling an operation in said ion implanter in response to detecting said moment.

* * * * *